United States Patent
Lee et al.

(10) Patent No.: US 9,171,627 B2
(45) Date of Patent: Oct. 27, 2015

(54) NON-BOOSTING PROGRAM INHIBIT SCHEME IN NAND DESIGN

(71) Applicant: Aplus Flash Technology, Inc, San Jose, CA (US)

(72) Inventors: Peter Wung Lee, Saratoga, CA (US); Hsing-Ya Tsao, San Jose, CA (US)

(73) Assignee: Aplus Flash Technology, Inc., Fremont, CA (US)

( * ) Notice: Subject to any disclaimer, the term of this patent is extended or adjusted under 35 U.S.C. 154(b) by 147 days.

(21) Appl. No.: 13/843,642

(22) Filed: Mar. 15, 2013

(65) Prior Publication Data

US 2013/0272067 A1    Oct. 17, 2013

Related U.S. Application Data

(60) Provisional application No. 61/686,805, filed on Apr. 11, 2012.

(51) Int. Cl.
 G11C 16/10    (2006.01)
 G11C 16/04    (2006.01)

(52) U.S. Cl.
 CPC ............ *G11C 16/10* (2013.01); *G11C 16/0483* (2013.01)

(58) Field of Classification Search
 CPC ...................................................... G11C 16/10
 USPC .................................................... 368/185.18
 See application file for complete search history.

(56) References Cited

U.S. PATENT DOCUMENTS

| | | | |
|---|---|---|---|
| 5,734,609 A | 3/1998 | Choi et al. | |
| 5,867,429 A | 2/1999 | Chen et al. | |
| 6,522,580 B2 | 2/2003 | Chen et al. | |
| 6,542,407 B1 | 4/2003 | Chen et al. | |
| 6,781,877 B2 | 8/2004 | Cernea et al. | |
| 6,807,095 B2 | 10/2004 | Chen et al. | |
| 6,847,553 B2 | 1/2005 | Chen et al. | |
| 6,870,768 B2 | 3/2005 | Cernea et al. | |
| 6,917,542 B2 | 7/2005 | Chen et al. | |
| 7,046,548 B2 | 5/2006 | Cernea et al. | |
| 7,061,798 B2 | 6/2006 | Chen et al. | |
| 7,102,924 B2 | 9/2006 | Chen et al. | |
| 7,187,585 B2 | 3/2007 | Li et al. | |
| 7,196,928 B2 | 3/2007 | Chen | |
| 7,196,946 B2 | 3/2007 | Chen et al. | |
| 7,224,613 B2 | 5/2007 | Chen et al. | |
| 7,289,344 B2 | 10/2007 | Chen | |
| 7,289,348 B2 | 10/2007 | Chen | |
| 7,301,808 B2 | 11/2007 | Li et al. | |
| 7,301,813 B2 | 11/2007 | Chen | |
| 7,301,839 B2 | 11/2007 | Li et al. | |
| 7,315,477 B2 | 1/2008 | Chen | |
| 7,321,510 B2 | 1/2008 | Li et al. | |
| 7,372,730 B2 | 5/2008 | Chen | |

(Continued)

*Primary Examiner* — Min Huang
(74) *Attorney, Agent, or Firm* — Raywell Group, LLC

(57) ABSTRACT

A low-current FN channel scheme for erase, program, program-inhibit and read operations is disclosed for NAND NVM memories. This invention discloses a block array architecture and 3-step half-page program algorithm to achieve less error rate of NAND cell threshold voltage level. Thus, the error correction code capability requirement can be reduced, thus the program yield can be increased to reduce the overall NAND die cost at advanced nodes below 20 nm. As a result, this NAND array can still use the LV, compact PGM buffer for saving in the silicon area and power consumption. In addition, the simpler on-chip state-machine design can be achieved with the superior quality of less program errors.

33 Claims, 28 Drawing Sheets

(56) References Cited

U.S. PATENT DOCUMENTS

| | | |
|---|---|---|
| 7,397,698 B2 | 7/2008 | Fong et al. |
| 7,443,729 B2 | 10/2008 | Li et al. |
| 7,499,329 B2 | 3/2009 | Nazarian |
| 7,697,333 B2 | 4/2010 | Isobe |
| 7,965,555 B2 | 6/2011 | Namiki et al. |
| 8,023,327 B2 | 9/2011 | Futatsuyama |
| 8,089,806 B2 | 1/2012 | Takada |
| 8,102,711 B2 | 1/2012 | Maejima |
| 8,154,941 B2 | 4/2012 | Ito |
| 2001/0005015 A1* | 6/2001 | Futatsuyama et al. ............ 257/1 |
| 2008/0144380 A1* | 6/2008 | Youn et al. ................ 365/185.09 |
| 2008/0205140 A1* | 8/2008 | Lee et al. ................ 365/185.03 |
| 2009/0290422 A1* | 11/2009 | Cha et al. ................ 365/185.19 |
| 2011/0090738 A1* | 4/2011 | Park et al. ................ 365/185.17 |
| 2011/0242892 A1* | 10/2011 | Namiki et al. ........... 365/185.17 |
| 2012/0262986 A1* | 10/2012 | Kim et al. ................ 365/185.02 |

\* cited by examiner

|  |  | Erase |
|---|---|---|
| Selected Block | BLG | Floating |
|  | DMWL[0] | 0V |
|  | WL[1] | 0V |
|  | WL[2] | 0V |
|  | WL[K-1] | 0V |
|  | WL{K} | 0V |
|  | DMWL[1] | 0V |
|  | SLG[0] | Floating |
|  | SLG[1] | Floating |
|  | CSL | Floating |
| Unselected Block | BLG | Floating |
|  | DMWL[0] | Floating |
|  | WL[1] | Floating |
|  | WL[2] | Floating |
|  | WL[K-1] | Floating |
|  | WL{K} | Floating |
|  | DMWL[1] | Floating |
|  | SLG[0] | Floating |
|  | SLG[1] | Floating |
|  | CSL | Floating |
|  | CSL (shared with sel Blk) | Floating |
|  | BL1 | Floating |
|  | BL2 | Floating |
|  | BLN | Floating |
|  | P_WELL | Verase |

Verase=18~22V

FIG. 7

| | PGM_Precharge | | | | |
|---|---|---|---|---|---|
| Cell[BL,WL] | | Cell[2,1] | Cell[2,2] | Cell[2,K-1] | Cell[2,K] |
| Selected Block | BLG | 0V | 0V | 0V | 0V |
| | DMWL[0] | Vpass1 | Vdd | Vdd | Vdd |
| | WL[1] | Vpass2 | Vpass1 | Vdd | Vdd |
| | WL[2] | Vpass2 | Vpass2 | Vdd | Vdd |
| | WL[K-1] | Vpass2 | Vpass2 | Vpass2 | Vpass1 |
| | WL{K} | Vpass2 | Vpass2 | Vpass2 | Vpass2 |
| | DMWL[1] | Vpass1 | Vpass1 | Vpass1 | Vpass1 |
| | SLG[0] | Vpass1 | Vpass1 | Vpass1 | Vpass1 |
| | SLG[1] | Vpass1 | Vpass1 | Vpass1 | Vpass1 |
| | CSL | Vinh | Vinh | Vinh | Vinh |
| Unselected Block | BLG | 0V | 0V | 0V | 0V |
| | DMWL[0] | Floating | Floating | Floating | Floating |
| | WL[1] | Floating | Floating | Floating | Floating |
| | WL[2] | Floating | Floating | Floating | Floating |
| | WL[K-1] | Floating | Floating | Floating | Floating |
| | WL{K} | Floating | Floating | Floating | Floating |
| | DMWL[1] | Floating | Floating | Floating | Floating |
| | SLG[0] | 0V | 0V | 0V | 0V |
| | SLG[1] | 0V | 0V | 0V | 0V |
| | CSL | 0V | 0V | 0V | 0V |
| | CSL (shared with sel Blk) | Vinh | Vinh | Vinh | Vinh |
| | BL1 | Vdd | Vdd | Vdd | Vdd |
| | BL2 | Vdd | Vdd | Vdd | Vdd |
| | BLN | Vdd | Vdd | Vdd | Vdd |
| | P_WELL | 0V | 0V | 0V | 0V |

| Vpgm | Vpass1 | Vpass2 | Vinh | Vdd |
|---|---|---|---|---|
| 15~22V | 9~11V | 6~8V | 6~8V | 1.6~3.6V |

FIG. 10a

|  | PGM_Data_Setting | | | | |
|---|---|---|---|---|---|
| Cell[BL,WL] | Cell[2,1] | Cell[2,2] | Cell[2,K-1] | Cell[2,K] | |
| Selected Block | BLG | Vdd | Vdd | Vdd | Vdd |
| | DMWL[0] | Vpass1 | Vdd | Vdd | Vdd |
| | WL[1] | Vpass2 | Vpass1 | Vdd | Vdd |
| | WL[2] | Vpass2 | Vpass2 | Vdd | Vdd |
| | WL[K-1] | Vpass2 | Vpass2 | Vpass2 | Vpass1 |
| | WL{K} | Vpass2 | Vpass2 | Vpass2 | Vpass2 |
| | DMWL[1] | Vpass1 | Vpass1 | Vpass1 | Vpass1 |
| | SLG[0] | Vpass1 | Vpass1 | Vpass1 | Vpass1 |
| | SLG[1] | 0V | 0V | 0V | 0V |
| | CSL | Vinh | Vinh | Vinh | Vinh |
| Unselected Block | BLG | 0V | 0V | 0V | 0V |
| | DMWL[0] | Floating | Floating | Floating | Floating |
| | WL[1] | Floating | Floating | Floating | Floating |
| | WL[2] | Floating | Floating | Floating | Floating |
| | WL[K-1] | Floating | Floating | Floating | Floating |
| | WL{K} | Floating | Floating | Floating | Floating |
| | DMWL[1] | Floating | Floating | Floating | Floating |
| | SLG[0] | 0V | 0V | 0V | 0V |
| | SLG[1] | 0V | 0V | 0V | 0V |
| | CSL | 0V | 0V | 0V | 0V |
| | CSL (shared with sel Blk) | Vinh | Vinh | Vinh | Vinh |
| | BL1 | Vdd | Vdd | Vdd | Vdd |
| | BL2 | 0V | 0V | 0V | 0V |
| | BLN | Vdd | Vdd | Vdd | Vdd |
| | P_WELL | 0V | 0V | 0V | 0V |

| Vpgm | Vpass1 | Vpass2 | Vinh | Vdd |
|---|---|---|---|---|
| 15~22V | 9~11V | 6~8V | 6~8V | 1.6~3.6V |

FIG. 10b

|  |  | PGM_Program | | | |
|---|---|---|---|---|---|
|  | Cell[BL,WL] | Cell[2,1] | Cell[2,2] | Cell[2,K-1] | Cell[2,K] |
| Selected Block | BLG | Vdd | Vdd | Vdd | Vdd |
|  | DMWL[0] | Vpass1 | Vdd | Vdd | Vdd |
|  | WL[1] | Vpgm | Vpass1 | Vdd | Vdd |
|  | WL[2] | Vpass2 | Vpgm | Vdd | Vdd |
|  | WL[K-1] | Vpass2 | Vpass2 | Vpgm | Vpass1 |
|  | WL{K} | Vpass2 | Vpass2 | Vpass2 | Vpgm |
|  | DMWL[1] | Vpass1 | Vpass1 | Vpass1 | Vpass1 |
|  | SLG[0] | Vpass1 | Vpass1 | Vpass1 | Vpass1 |
|  | SLG[1] | 0V | 0V | 0V | 0V |
|  | CSL | Vinh | Vinh | Vinh | Vinh |
| Unselected Block | BLG | 0V | 0V | 0V | 0V |
|  | DMWL[0] | Floating | Floating | Floating | Floating |
|  | WL[1] | Floating | Floating | Floating | Floating |
|  | WL[2] | Floating | Floating | Floating | Floating |
|  | WL[K-1] | Floating | Floating | Floating | Floating |
|  | WL{K} | Floating | Floating | Floating | Floating |
|  | DMWL[1] | Floating | Floating | Floating | Floating |
|  | SLG[0] | 0V | 0V | 0V | 0V |
|  | SLG[1] | 0V | 0V | 0V | 0V |
|  | CSL | 0V | 0V | 0V | 0V |
|  | CSL (shared with sel Blk) | Vinh | Vinh | Vinh | Vinh |
|  | BL1 | Vdd | Vdd | Vdd | Vdd |
|  | BL2 | 0V | 0V | 0V | 0V |
|  | BLN | Vdd | Vdd | Vdd | Vdd |
|  | P_WELL | 0V | 0V | 0V | 0V |

| Vpgm | Vpass1 | Vpass2 | Vinh | Vdd |
|---|---|---|---|---|
| 15~22V | 9~11V | 6~8V | 6~8V | 1.6~3.6V |

FIG. 10c

|  |  | Read | | | |
|---|---|---|---|---|---|
|  | Cell[BL,WL] | Cell[2,1] | Cell[2,2] | Cell[2,K-1] | Cell[2,K] |
| Selected Block | BLG | Vdd | Vdd | Vdd | Vdd |
|  | DMWL[0] | Vpass3 | Vpass3 | Vpass3 | Vpass3 |
|  | WL[1] | Vr1/Vr2/Vr3 | Vpass3 | Vpass3 | Vpass3 |
|  | WL[2] | Vpass3 | Vr1/Vr2/Vr3 | Vpass3 | Vpass3 |
|  | WL[K-1] | Vpass3 | Vpass3 | Vr1/Vr2/Vr3 | Vpass3 |
|  | WL{K} | Vpass3 | Vpass3 | Vpass3 | Vr1/Vr2/Vr3 |
|  | DMWL[1] | Vpass3 | Vpass3 | Vpass3 | Vpass3 |
|  | SLG[0] | Vdd | Vdd | Vdd | Vdd |
|  | SLG[1] | Vdd | Vdd | Vdd | Vdd |
|  | CSL | 0V | 0V | 0V | 0V |
| Unselected Block | BLG | 0V | 0V | 0V | 0V |
|  | DMWL[0] | Floating | Floating | Floating | Floating |
|  | WL[1] | Floating | Floating | Floating | Floating |
|  | WL[2] | Floating | Floating | Floating | Floating |
|  | WL[K-1] | Floating | Floating | Floating | Floating |
|  | WL{K} | Floating | Floating | Floating | Floating |
|  | DMWL[1] | Floating | Floating | Floating | Floating |
|  | SLG[0] | 0V | 0V | 0V | 0V |
|  | SLG[1] | 0V | 0V | 0V | 0V |
|  | CSL | 0V | 0V | 0V | 0V |
|  | CSL (shared with sel Blk) | 0V | 0V | 0V | 0V |
|  | BL[1] | 0.5V or 0V | 0.5V or 0V | 0.5V or 0V | 0.5V or 0V |
|  | BL[2] | 0.5V or 0V | 0.5V or 0V | 0.5V or 0V | 0.5V or 0V |
|  | BL[N] | 0.5V or 0V | 0.5V or 0V | 0.5V or 0V | 0.5V or 0V |
|  | P_WELL | 0V | 0V | 0V | 0V |

| Vpass3 | Vr1 | Vr2 | Vr3 | Vdd |
|---|---|---|---|---|
| 5~6V | ~1.5V | ~2.5V | ~3.5V | 2~3V |

FIG. 13

|  |  | Erase |
|---|---|---|
| Selected Block | BLG | Floating |
|  | DM WL[0] | 0V |
|  | WL[1] | 0V |
|  | WL[2] | 0V |
|  | WL[K-1] | 0V |
|  | WL{K} | 0V |
|  | DM WL[1] | 0V |
|  | SLG[0] | Floating |
|  | SLG[1] | Floating |
|  | CSL[0] | Floating |
|  | CSL[1] | Floating |
| Unselected Block | BLG | Floating |
|  | DM WL[0] | Floating |
|  | WL[1] | Floating |
|  | WL[2] | Floating |
|  | WL[K-1] | Floating |
|  | WL{K} | Floating |
|  | DM WL[1] | Floating |
|  | SLG[0] | Floating |
|  | SLG[1] | Floating |
|  | CSL[0] | Floating |
|  | CSL[0] (shared with sel Blk) | Floating |
|  | CSL[1] | Floating |
|  | CSL[1] (shared with sel Blk) | Floating |
|  | BL1 | Floating |
|  | BL2 | Floating |
|  | BLN | Floating |
|  | P_WELL | Verase |

Verase=18~22V

FIG. 16

| | PGM_Precharge | | | | |
|---|---|---|---|---|---|
| Cell[BL,WL] | Cell[2,1] | Cell[2,2] | Cell[2,K-1] | Cell[2,K] | |
| Selected Block | | | | | |
| BLG | 0V | 0V | 0V | 0V | |
| DMWL[0] | Vpass1 | Vdd | Vdd | Vdd | |
| WL[1] | Vpass2 | Vpass1 | Vdd | Vdd | |
| WL[2] | Vpass2 | Vpass2 | Vdd | Vdd | |
| WL[K-1] | Vpass2 | Vpass2 | Vpass2 | Vpass1 | |
| WL{K} | Vpass2 | Vpass2 | Vpass2 | Vpass2 | |
| DMWL[1] | Vpass1 | Vpass1 | Vpass1 | Vpass1 | |
| SLG[0] | Vpass1 | Vpass1 | Vpass1 | Vpass1 | |
| SLG[1] | Vpass1 | Vpass1 | Vpass1 | Vpass1 | |
| CSL[0] | Vinh | Vinh | Vinh | Vinh | |
| CSL[1] | Vinh | Vinh | Vinh | Vinh | |
| Unselected Block | | | | | |
| BLG | 0V | 0V | 0V | 0V | |
| DMWL[0] | Floating | Floating | Floating | Floating | |
| WL[1] | Floating | Floating | Floating | Floating | |
| WL[2] | Floating | Floating | Floating | Floating | |
| WL[K-1] | Floating | Floating | Floating | Floating | |
| WL{K} | Floating | Floating | Floating | Floating | |
| DMWL[1] | Floating | Floating | Floating | Floating | |
| SLG[0] | 0V | 0V | 0V | 0V | |
| SLG[1] | 0V | 0V | 0V | 0V | |
| CSL[0] | 0V | 0V | 0V | 0V | |
| CSL[0] (shared with sel Blk) | Vinh | Vinh | Vinh | Vinh | |
| CSL[1] | 0V | 0V | 0V | 0V | |
| CSL[1] (shared with sel Blk) | Vinh | Vinh | Vinh | Vinh | |
| BL1 | Vdd | Vdd | Vdd | Vdd | |
| BL2 | Vdd | Vdd | Vdd | Vdd | |
| BLN | Vdd | Vdd | Vdd | Vdd | |
| P_WELL | 0V | 0V | 0V | 0V | |

| Vpgm | Vpass1 | Vpass2 | Vinh | Vdd |
|---|---|---|---|---|
| 15~22V | 9~11V | 6~8V | 6~8V | 1.6~3.6V |

FIG. 18a

| | | PGM_Data_Setting | | | |
|---|---|---|---|---|---|
| | Cell[BL,WL] | Cell[2,1] | Cell[2,2] | Cell[2,K-1] | Cell[2,K] |
| Selected Block | BLG | Vdd | Vdd | Vdd | Vdd |
| | DMWL[0] | Vpass1 | Vdd | Vdd | Vdd |
| | WL[1] | Vpass2 | Vpass1 | Vdd | Vdd |
| | WL[2] | Vpass2 | Vpass2 | Vdd | Vdd |
| | WL[K-1] | Vpass2 | Vpass2 | Vpass2 | Vpass1 |
| | WL{K} | Vpass2 | Vpass2 | Vpass2 | Vpass2 |
| | DMWL[1] | Vpass1 | Vpass1 | Vpass1 | Vpass1 |
| | SLG[0] | Vpass1 | Vpass1 | Vpass1 | Vpass1 |
| | SLG[1] | 0V | 0V | 0V | 0V |
| | CSL[0] | Vinh | Vinh | Vinh | Vinh |
| | CSL[1] | Vdd | Vdd | Vdd | Vdd |
| Unselected Block | BLG | 0V | 0V | 0V | 0V |
| | DMWL[0] | Floating | Floating | Floating | Floating |
| | WL[1] | Floating | Floating | Floating | Floating |
| | WL[2] | Floating | Floating | Floating | Floating |
| | WL[K-1] | Floating | Floating | Floating | Floating |
| | WL{K} | Floating | Floating | Floating | Floating |
| | DMWL[1] | Floating | Floating | Floating | Floating |
| | SLG[0] | 0V | 0V | 0V | 0V |
| | SLG[1] | 0V | 0V | 0V | 0V |
| | CSL[0] | 0V | 0V | 0V | 0V |
| | CSL[0] (shared with sel Blk) | Vinh | Vinh | Vinh | Vinh |
| | CSL[1] | 0V | 0V | 0V | 0V |
| | CSL[1] (shared with sel Blk) | Vdd | Vdd | Vdd | Vdd |
| | BL1 | Vdd | Vdd | Vdd | Vdd |
| | BL2 | 0V | 0V | 0V | 0V |
| | BLN | Vdd | Vdd | Vdd | Vdd |
| | P_WELL | 0V | 0V | 0V | 0V |

| Vpgm | Vpass1 | Vpass2 | Vinh | Vdd |
|---|---|---|---|---|
| 15~22V | 9~11V | 6~8V | 6~8V | 1.6~3.6V |

FIG. 18b

| | PGM_Program | | | |
|---|---|---|---|---|
| Cell[BL,WL] | Cell[2,1] | Cell[2,2] | Cell[2,K-1] | Cell[2,K] |
| Selected Block — BLG | Vdd | Vdd | Vdd | Vdd |
| DMWL[0] | Vpass1 | Vdd | Vdd | Vdd |
| WL[1] | Vpgm | Vpass1 | Vdd | Vdd |
| WL[2] | Vpass2 | Vpgm | Vdd | Vdd |
| WL[K-1] | Vpass2 | Vpass2 | Vpgm | Vpass1 |
| WL{K} | Vpass2 | Vpass2 | Vpass2 | Vpgm |
| DMWL[1] | Vpass1 | Vpass1 | Vpass1 | Vpass1 |
| SLG[0] | Vpass1 | Vpass1 | Vpass1 | Vpass1 |
| SLG[1] | 0V | 0V | 0V | 0V |
| CSL[0] | Vinh | Vinh | Vinh | Vinh |
| CSL[1] | Vdd | Vdd | Vdd | Vdd |
| Unselected Block — BLG | 0V | 0V | 0V | 0V |
| DMWL[0] | Floating | Floating | Floating | Floating |
| WL[1] | Floating | Floating | Floating | Floating |
| WL[2] | Floating | Floating | Floating | Floating |
| WL[K-1] | Floating | Floating | Floating | Floating |
| WL{K} | Floating | Floating | Floating | Floating |
| DMWL[1] | Floating | Floating | Floating | Floating |
| SLG[0] | 0V | 0V | 0V | 0V |
| SLG[1] | 0V | 0V | 0V | 0V |
| CSL[0] | 0V | 0V | 0V | 0V |
| CSL[0] (shared with sel Blk) | Vinh | Vinh | Vinh | Vinh |
| CSL[1] | 0V | 0V | 0V | 0V |
| CSL[1] (shared with sel Blk) | Vdd | Vdd | Vdd | Vdd |
| BL1 | Vdd | Vdd | Vdd | Vdd |
| BL2 | 0V | 0V | 0V | 0V |
| BLN | Vdd | Vdd | Vdd | Vdd |
| P_WELL | 0V | 0V | 0V | 0V |

| Vpgm | Vpass1 | Vpass2 | Vinh | Vdd |
|---|---|---|---|---|
| 15~22V | 9~11V | 6~8V | 6~8V | 1.6~3.6V |

FIG. 18c

| | | Read | | | |
|---|---|---|---|---|---|
| | Cell[BL,WL] | Cell[2,1] | Cell[2,2] | Cell[2,K-1] | Cell[2,K] |
| Selected Block | BLG | Vdd | Vdd | Vdd | Vdd |
| | DMWL[0] | Vpass3 | Vpass3 | Vpass3 | Vpass3 |
| | WL[1] | Vr1/Vr2/Vr3 | Vpass3 | Vpass3 | Vpass3 |
| | WL[2] | Vpass3 | Vr1/Vr2/Vr3 | Vpass3 | Vpass3 |
| | WL[K-1] | Vpass3 | Vpass3 | Vr1/Vr2/Vr3 | Vpass3 |
| | WL{K} | Vpass3 | Vpass3 | Vpass3 | Vr1/Vr2/Vr3 |
| | DMWL[1] | Vpass3 | Vpass3 | Vpass3 | Vpass3 |
| | SLG[0] | Vdd | Vdd | Vdd | Vdd |
| | SLG[1] | Vdd | Vdd | Vdd | Vdd |
| | CSL[0] | 0V | 0V | 0V | 0V |
| | CSL[1] | 0V | 0V | 0V | 0V |
| Unselected Block | BLG | 0V | 0V | 0V | 0V |
| | DMWL[0] | Floating | Floating | Floating | Floating |
| | WL[1] | Floating | Floating | Floating | Floating |
| | WL[2] | Floating | Floating | Floating | Floating |
| | WL[K-1] | Floating | Floating | Floating | Floating |
| | WL{K} | Floating | Floating | Floating | Floating |
| | DMWL[1] | Floating | Floating | Floating | Floating |
| | SLG[0] | 0V | 0V | 0V | 0V |
| | SLG[1] | 0V | 0V | 0V | 0V |
| | CSL[0] | 0V | 0V | 0V | 0V |
| | CSL[0] (shared with sel Blk) | 0V | 0V | 0V | 0V |
| | CSL[1] | 0V | 0V | 0V | 0V |
| | CSL[1] (shared with sel Blk) | 0V | 0V | 0V | 0V |
| | BL[1] | 0.5V or 0V | 0.5V or 0V | 0.5V or 0V | 0.5V or 0V |
| | BL[2] | 0.5V or 0V | 0.5V or 0V | 0.5V or 0V | 0.5V or 0V |
| | BL[N] | 0.5V or 0V | 0.5V or 0V | 0.5V or 0V | 0.5V or 0V |
| | P_WELL | 0V | 0V | 0V | 0V |

| Vpass3 | vr1 | Vr2 | Vr3 | Vdd |
|---|---|---|---|---|
| 5~6V | ~1.5V | ~2.5V | ~3.5V | 1.6~3.6V |

FIG. 20

NON-BOOSTING PROGRAM INHIBIT SCHEME IN NAND DESIGN

CROSS-REFERENCES TO RELATED APPLICATIONS

This application claims priority to U.S. Provisional Patent Application No. 61/686,805, filed on Apr. 11, 2012, commonly assigned, and hereby incorporated by reference in its entirety herein for all purposes.

This application is related to U.S. patent application Ser. No. 13/680,286, filed on Nov. 19, 2012 and PCT Application No. PCT/US2012/065734, filed on Nov. 18, 2012, commonly assigned, and hereby incorporated by reference in its entirety herein for all purposes.

BACKGROUND OF THE INVENTION

The present invention relates generally to nonvolatile memory technology. More particularly, the present invention relates to a non-boosting program-inhibit scheme used in NAND flash memory design with low-voltage page buffer. Applications of the present invention can be expanded to current NAND design to HiNAND string and array by using a direct, non-boosting scheme to achieve more reliable program-inhibit operation, though more applications may be recognized on all Nonvolatile memory (NVM) cells that are using the similar extremely low current FN-channel erase and FN-channel program.

Nonvolatile memory is well known in the art. The different types of nonvolatile memory that employ a charge retention mechanism include Read-Only-Memory (ROM), Electrically Programmable Read Only Memory (EPROM), Electrically Erasable Programmable Read Only Memory (EEPROM), NOR Flash Memory, and NAND Flash Memory. The charge retention mechanism may be charge storage, as in a floating gate memory cell, a so-called Flash-based cell.

The NAND Flash memory cell design has several advantages. Firstly, its cell size is highly scalable and is able to have a cell size that is a factor of approximately four times (4×) larger than the minimum feature size ($\lambda^2$) of the manufacturing technology. This has held in technologies with feature sizes from 0.25 µm down to 20 nm. This is the smallest nonvolatile memory cell when compared to other nonvolatile cell types. Secondly, NAND Flash memory cell design uses a low-current Fowler-Nordheim (FN) tunneling phenomena for both program and erase operations. The FN tunneling allows the program and erase operations to be performed in relatively larger memory unit sizes and a faster speed. The FN erase operation is typically performed in a unit of a large sector with sizes ranging from 512 Kb to 2 Mb and 1 ms fast erase time in current specifications. The FN program is performed in a unit of a large page size varying from 512 B to 2 KB with a fast speed of 200 µs typically in the current specifications. Like EEPROM and NOR flash, NAND Flash memory provides the repeatedly in-system or in-circuit electrically programmable and erasable functions with the lowest die cost.

The major NAND cell and the cell array structures and operations from different NAND memory chip manufacturers are very similar. The mainstream NAND cells are either made of 2-poly floating-gate NMOS or 1-poly charge-trapping NMOS storage devices. In a charge trapping mechanism, as in a Silicon-Oxide-Nitride-Oxide-Silicon (SONOS) or Metal-Oxide-Nitride-Oxide-Silicon (MONOS) type cell, the charge is trapped in a charge trapping layer between two insulating layers. The charge trapping layer in the SONOS/MONOS devices has a relatively high dielectric constant (k) such Silicon Nitride ($SiN_x$).

Currently, the mainstream standalone NAND in mass production is mainly based only 2-poly floating-gate NMOS device. The NAND flash is employing the extremely HV (high-voltage) but low current FN channel-erase and FN channel-program scheme to change the stored data. In the traditional NAND designs a local-boosting program-inhibit scheme is adopted to generate 7V in the selected NAND cell's channel to suppress FN program, which is unreliable. Furthermore, an on-chip HV charge-pump must be active all the times during the program and program-inhibit operations. Therefore it is desired to have a fast and low-current program and program-inhibit operations. As oppose to the existing unreliable local-boosting program inhibit scheme to generate 7V in the selected NAND cell's channel to suppress FN program in today's NAND, a direct, non-boosting scheme to achieve more reliable program-inhibit operation is preferred.

Furthermore, it is desirable to have improved NAND array design so that the operations of those popular NAND string and array with their cells employing the similar write scheme of HV but low-current FN channel-erase and FN channel-program can allow the use of very compact LV (low-voltage) page buffer and smaller HV charge-pump circuit for achieving drastic reduction in both die size and power consumption in write operation.

Therefore, improved NAND operation schemes as well as new NAND memory array architectures are needed and become objectives of the present invention.

BRIEF SUMMARY OF THE INVENTION

This invention is fully focusing on the program and program-inhibit operations of NAND cell, NAND cell string and NAND cell array that is employing the HV but extremely low current FN program operation. More particularly, the focus of this invention is to provide a novel approach for the fast and low-current program and program-inhibit operations so that the saving of the power consumption can be achieved. The invented approach of the present invention can be applied to all NMV cells that are using the similar extremely low current FN-channel erase and FN-channel program.

An object of this invention is to provide a novel low-current non-boosting Program and Program-Inhibit circuit architecture for operation of today's mainstream NAND flash string and memory array without any process change.

Furthermore, another object of this invention is to provide a pair of NAND string decoders for proper low-current FN tunneling Program and Program-Inhibit operation of today's NAND array architecture. The preferable string-decoder is comprised of two parts. The bottom string-decoder has end connected to the local source nodes of dummy WLs of corresponding odd-numbered and even-numbered NAND strings in the array structure and another end connected to a common source line from output of an X-decoder. The top string-decoder has one end connected to the outputs, Global BLs, of Page buffer and the other end connected to the respective drains nodes of remaining dummy WLs of the odd-numbered and even-numbered NAND strings. Furthermore, the bottom string-decoders are divided into odd and even string-decoders by gating to odd and even selected signals, SLG[0,1] to separate local source lines based on odd and even-column. The top string-decoder is gated to a common gate input BLG which retains all the local bit lines not to be divided into odd and even group.

Still further, an object of this invention is to provide a novel new NAND array with an unique odd and even string decoders for overall NAND read, program, program-inhibit, erase and erase-inhibit operations with a LV-page buffer without using the unreliable Local-Boosting Program-Inhibit scheme.

Still further, another object of this invention is to provide a novel new NAND array with a shielding method and apparatus applied alternating in odd and even NAND strings so that the initial pre-charged program-inhibit voltage can be retained without being mistakenly discharged. The undesired discharge is due to the coupling effect between NAND strings when some of the page buffer's stored data is "0" that would pull down the HV program-inhibit voltage in the selected BLs of NAND array.

Even further, another object of this invention is to provide a 3-step Program and program-inhibit algorithm to secure the proper low-current FN-tunneling operation of NAND array in page program operation. The first step is defined as a pre-charge period. It is used to fully charge all selected odd and even NAND strings in unit of full page in the selected block only through the opening of the selected SL-decoder and the bottom string-decoder without leaking to the global BLs to the LV Page buffer. After completion of pre-charge of program-inhibit voltage, the bottom string-decoder would be shut off from connecting to the local SL and local SL decoder to retain the program-inhibit voltage in all the NAND strings of the selected block. The second step is defined as a data-setting period according to the corresponding half-page of stored data in the Page buffer. After this period, provided all odd BLs are selected first, then all odd BLs would be accurately, safely retaining either program-inhibit voltage by always turning on odd local SL decoder to keep its coupling with the program-inhibit voltage from CSL or being discharged to 0V or VSS independently without being affected by any coupling noise due to the even BLs shielding protection. The third step is defined as a program period of the half-page program operation for the selected NAND page as the continuation of the second step explained above.

To accomplish at least one of these objects, an embodiment includes a method of cell array operation and array memory division for the above mentioned NAND array to enable using a small LV page-buffer along with the string-decoder, SL-decoder and deep erasing, and erase verifying, programming, and program verifying NAND memory cells in the NAND strings.

A block of a NAND array comprising of the NAND memory cell strings are arranged in plurality of rows and columns. Each of NAND flash memory cell string is formed of n NAND flash cells sandwiched with two select transistors placed on both top and bottom ends in series. The LV page buffers with same width of BL numbers is placed on top of the array with its plurality of outputs connected to all BLs which are divided into two equal groups such as the odd and even groups.

Another object of this invention is to provide a two high-voltage (HV) divided common source lines, CSL[0] and CSL[1], directly connecting from an X-decoder with a Program-Inhibit Voltage Vinh or a lower Vdd voltage respectively to odd and even NAND strings selected by the bottom divided string decoder explained above. Since the Program-Inhibit Voltage Vinh only is supplied to the selected SLs during page program operation of the NAND flash array with rest SLs being lowered to Vdd voltage, thus the required HV charges is limited. As a result, the power consumption and silicon area of corresponding charge-pump circuit can be reduced.

In a specific embodiment, the present invention provides an NAND memory block circuit with non-boosting program-inhibit scheme. The NAND memory block includes a NAND cell array comprising a plurality of memory cells built in a common P-well region and arranged as multiple pages in rows and multiple strings in columns sharing a common source line. Each page is associated with a word line. Each string is associated with a local source line and a local bit line. The NAND memory block further includes a first string decoder located at one end of the multiple strings. The first string decoder includes a row of 1-poly NMOS select-gate transistors having a first common gate input and respectively connecting to local bit lines of corresponding strings and respective global bin lines. Additionally, the NAND memory block includes a second string decoder located at another end of the multiple strings. The second string decoder includes a row of divided odd-column and even-column 1-poly NMOS select-gate transistors for separating odd-column local source lines and even-column local source lines respectively gated by a second common gate input and a third common gate input to control their coupling to the common source line. The second string decoder is configured to independently select odd/even-column local source line voltages to maintain different local bit line voltages so that a programming operation can be performed in unit of half-page in which selected odd/even-column local bit lines are discharged to 0V while unselected even/odd-column bit lines independently retain a program-inhibit voltage without being affected by any coupling noise.

In another specific embodiment, the present invention provides a NAND memory sector circuit with non-boosting program-inhibit scheme. The NAND memory sector includes M numbers of NAND blocks arranged in series sharing a common P-well region and N global bit lines of BL1 through BLN respectively for N strings in y-direction. The M or N is an even number greater than 2 for a typical NAND memory array size. The NAND block includes a plurality of memory cells built in the common P-well region and arranged as pages in K rows and strings in the N columns sharing a common source line. Each page is associated with a word line. Each string is associated with a local source line and a local bit line. Each string of K cells is capped by two dummy cells respectively associated with two dummy word lines. K is an even number greater than 2 for typical NAND memory block size. The NAND block further includes a first string decoder located at one end of the N strings. The first string decoder includes a row of 1-poly NMOS select-gate transistors having a first common gate input and respectively connecting to local bit lines of corresponding strings and the N global bin lines BL1 through BLN. Furthermore, the NAND block includes a second string decoder located at another end of the N strings. The second string decoder includes a row of divided odd-column and even-column 1-poly NMOS select-gate transistors for separating odd-column local source lines and even-column local source lines respectively gated by a second common gate input and a third common gate input to control their coupling to the common source line. Additionally, the NAND memory sector includes an X-decoder circuit configured to connect a plurality of row-data lines in x-direction to the M numbers of NAND blocks. The x-direction is perpendicular to the y-direction. For each NAND block the plurality of row-data lines includes a top decoder line connected to the first common gate input, a pair of bottom decoder lines respectively connected to the second common gate input and the third common gate input. The same plurality of row-data lines includes K numbers of word lines respectively connected to the K pages and a pair of dummy word lines connected to the corresponding two dummy cells. The same plurality of row-data lines further includes a common source line coupled to the local source line of each of the N strings. Moreover, the NAND memory sector includes a low-voltage SA&PGM buffer circuit made from PMOS and NMOS devices with power supply voltages of 3V or less and connected in y-direction with all the global bit lines BL1 through BLN of the M numbers of NAND blocks. Each consecutive pair of NAND blocks shares the common source line. The second string decoder in each NAND block is divided to independently select odd/even-column local source line voltages to maintain different local bit line voltages so that a programming operation can be performed in unit of half-page in a selected block of the M numbers of NAND blocks during which selected odd/even-column local bit lines are discharged to 0V while unselected even/odd-column bit lines independently retain a program-inhibit voltage without being affected by any coupling noise.

In an alternative embodiment, the present invention provides a NAND memory sector circuit with non-boosting program-inhibit scheme. The NAND memory sector includes M numbers of NAND blocks arranged in series sharing a common P-well region and N global bit lines of BL1 through BLN respectively for N strings in y-direction, where M, N is an even number greater than 2. The NAND block includes a plurality of memory cells built in the common P-well region and arranged as pages in K rows and strings in the N columns. Each page is associated with a word line. Each string is associated with a local source line and a local bit line. Each string of K cells is capped by two dummy cells respectively associated with two dummy word lines, where K is an even number greater than 2. Additionally, the NAND block includes a first string decoder located at one end of the N strings. The first string decoder includes a row of 1-poly NMOS select-gate transistors having a first common gate input and respectively connecting to local bit lines of corresponding strings and the N global bin lines BL1 through BLN. The NAND block further includes a second string decoder located at another end of the N strings. The second string decoder includes a row of divided odd-column and even-column 1-poly NMOS select-gate transistors for separating odd-column local source lines and even-column local source lines respectively gated by a second common gate input and a third common gate input to control their couplings respectively to a first common source line and a second common source line. Furthermore, the NAND memory sector includes an X-decoder circuit configured to connect a plurality of row-data lines in x-direction to the M numbers of NAND blocks, where the x-direction is perpendicular to the y-direction. For each NAND block the plurality of row-data lines includes a top decoder line connected to the first common gate input, a pair of bottom decoder lines respectively connected to the second common gate input and the third common gate input. The same plurality of row-data lines further includes K numbers of word lines respectively connected to the K pages and a pair of dummy word lines connected to the corresponding two dummy cells. The same plurality of row-data lines also includes the first and second common source lines shared with a neighboring NAND block. Moreover, the NAND memory sector includes a low-voltage SA&PGM buffer circuit made from PMOS and NMOS devices with power supply voltages of 3V or less and connected in y-direction with all the global bit lines BL1 through BLN of the M numbers of NAND blocks. Each consecutive pair of NAND blocks shares the pair of the first and second common source lines. The second string decoder in each NAND block is divided to independently select odd/even-column local source line voltages to maintain different local bit line voltages so that a programming operation can be performed in unit of half-page in a selected block of the M numbers of NAND blocks during which selected odd/even-column local bit lines are discharged to 0V while unselected even/odd-column bit lines independently retain a program-inhibit voltage applied respectively through the second/first common source line without being affected by any coupling noise.

Further because this novel program and program-inhibit method, the traditional on-chip smaller LV page buffer can be kept without using the HV page buffer as it is commonly used in today's standalone NOR flash design. Furthermore, the traditional on-chip HV charge-pump must be active all the times during the program and program inhibit operations can only be needed in the beginning charge-up cycles and can be shut off for drastic power-saving.

Many benefits can be achieved by applying the embodiments of the present invention. These and other benefits may be described throughout the present specification and more particularly below.

BRIEF DESCRIPTION OF THE DRAWINGS

FIG. 7 is a table listed a set of bias voltage conditions for erase operation of a selected block according to an embodiment of the present invention.

FIG. 10a is a table listed a set of bias voltage conditions during a pre-charge period of half-page program operation of a selected cell according to an embodiment of the present invention.

FIG. 10b is a table listed a set of bias voltage conditions during a data-setting period of half-page program operation of a selected cell according to an embodiment of the present invention.

FIG. 10c is a table listed a set of bias voltage conditions during a program period of half-page program operation of a selected cell according to an embodiment of the present invention.

FIG. 13 is a table listed a set of bias voltage conditions for read operation of a selected cell according to an embodiment of the present invention.

FIG. 16 is a table listed a set of bias voltage conditions for erase operation of a selected block according to an alternative embodiment of the present invention.

FIG. 18a is a table listed a set of bias voltage conditions during a pre-charge period of half-page program operation of a selected cell according to an alternative embodiment of the present invention.

FIG. 18b is a table listed a set of bias voltage conditions during a data-setting period of half-page program operation of a selected cell according to an alternative embodiment of the present invention.

FIG. 18c is a table listed a set of bias voltage conditions during a program period of half-page program operation of a selected cell according to an alternative embodiment of the present invention.

FIG. 20 is a table listed a set of bias voltage conditions for read operation of a selected cell according to an alternative embodiment of the present invention.

DETAILED DESCRIPTION OF THE INVENTION

The present presentation relates to the continuation of improvement over the traditional NAND string and array employed HV Page buffer but extremely low-current FN program operation. More particularly, the present invention relates to a non-boosting program-inhibit scheme to expand current NAND design to HiNAND string and array to achieve more reliable program inhibit operation, though other applications may be recognized on all NVM cells that are using the similar extremely low-current FN-channel erase and FN-channel program.

Figure 1:
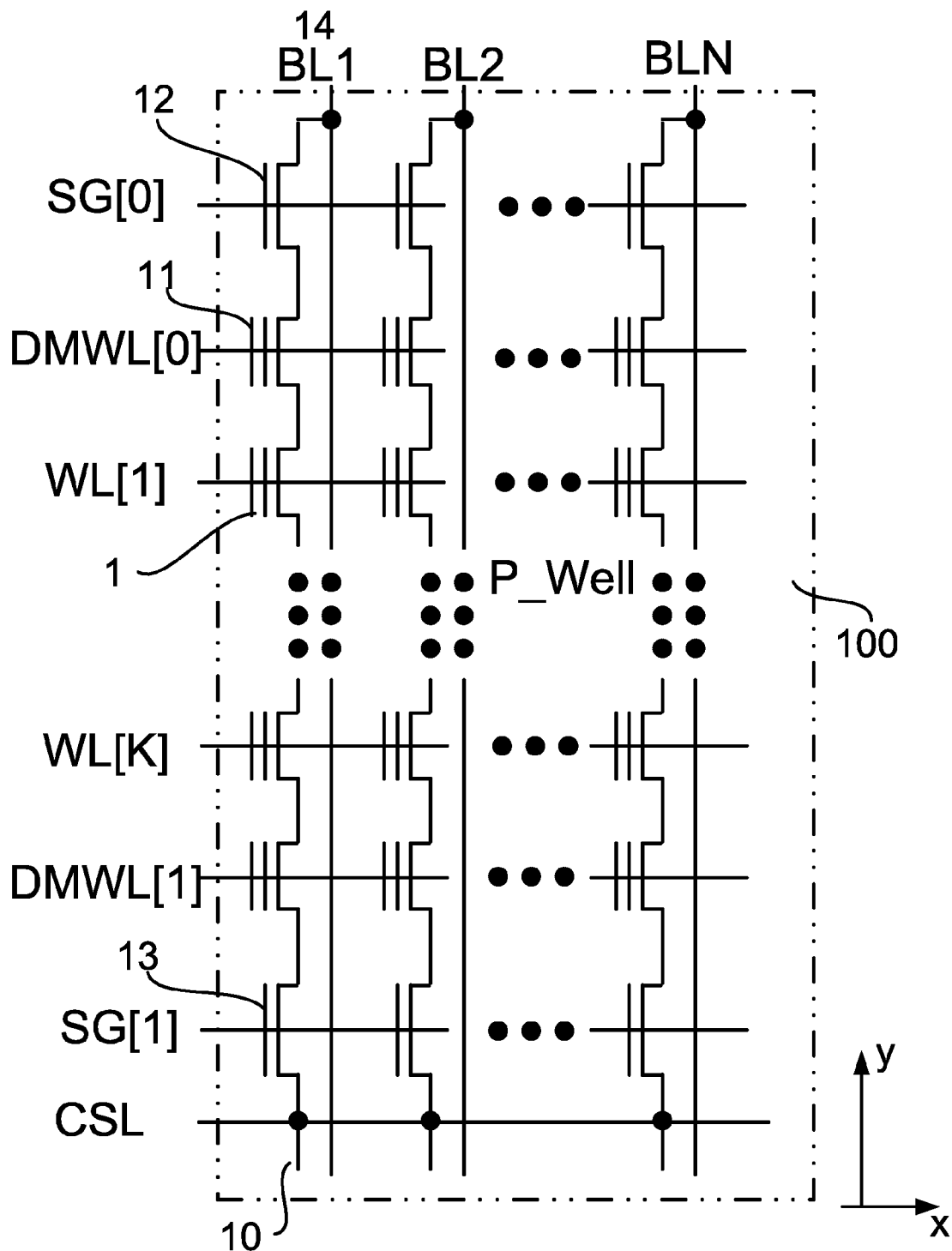
FIG. 1 is a schematic diagram of a typical NAND flash memory block having N vertical NAND strings according to prior art.

FIG. 1 is a schematic diagram of a typical NAND flash memory block having N vertical NAND strings according to prior art. Presenting this traditional NAND flash memory block diagram is merely used as part of an inventive process as described below. As seen, each NAND string 10 within the NAND memory block 100 comprises K 2-poly floating-gate NMOS NAND transistors 1 connected in series with a top and a bottom dummy cells 11 (the same 2-poly floating-gate NMOS NAND transistors). All these cells are respectively coupled to K word lines WLs as well as two dummy word lines such as DMWL[0] and DMWL[1]. Two 1-poly NMOS Select-gate (SG) transistors 12 and 13 located on top and bottom ends of the string gated respectively to two common gate line SG[0] and SG[1]. In some cases, the numbers of DMWL can be more than two on top and bottom. The whole NAND transistors including regular NAND cells 1 and dummy NAND cells 11 in each NAND string 10 are formed on a same Triple P-Well (TPW) region within same deep N-well (DNW) region designated on a common P-substrate with one common source line CSL and N separate bit lines BLs and K wordline WLs and two separate SG lines (SG[0] and SG[1]).

Each string 10 has total K plus additional dummy cells but it has only K-bit storage capacity. The top drain node of each string is connected to a tight metal-1 layer referred as BLN (N is a serial number of multiple bitlines) running vertically in y-direction as defined herein, while the bottom source node of each string 10 is connected to a common source line, referred as CSL, running horizontally in x-direction. The K gates of the K NAND transistors 111 are respectively connected to K wordlines WL[1] to WL[K], running horizontally in x-direction. Each WL is commonly referred as a single page in NAND flash memory. The top and bottom gates of SG transistors are connected to SG[0] and SG[1] respectively running in horizontal x-direction. The 1-poly NMOS transistor 12 with gate tied to SG[0] is referred as BL-select transistor, while the 1-poly NMOS transistor 13 with gate tied to SG[1] is referred as the SL-select transistor. Both BL-select and SL-select transistor is HV NMOS transistors that have to sustain 7.0V punch-through characteristics during the page program operation. Thus, the channel length of both BL-select and SL-select NMOS transistors have to be made large enough, which causes a large overhead of NAND cell strings in terms of silicon area.

On the contrary, each NAND cell 1 has no concern of the punch-through during the low-current FN tunneling scheme in z-direction (normal to the common P-substrate) that maintains Drain-Source voltage drop Vds=0, thus the NAND cell 1 can be made in a minimum pitch of 1λ, thus the smallest string can be achieved. But the whole NAND string 10 has the BL punch-through concern during the program-inhibit operation. The whole NAND transistors and both BL-select and SL-select transistors in the same NAND block 100 are formed on the same TPW region within the same DNW region on the common P-substrate with one common source line CSL and the N separate BLs, denoted as BL1 through BLN, K WLs, denoted as WL[1] through WL[K], and two separate SG lines such as SG[0] and SG[1].

Figure 2:
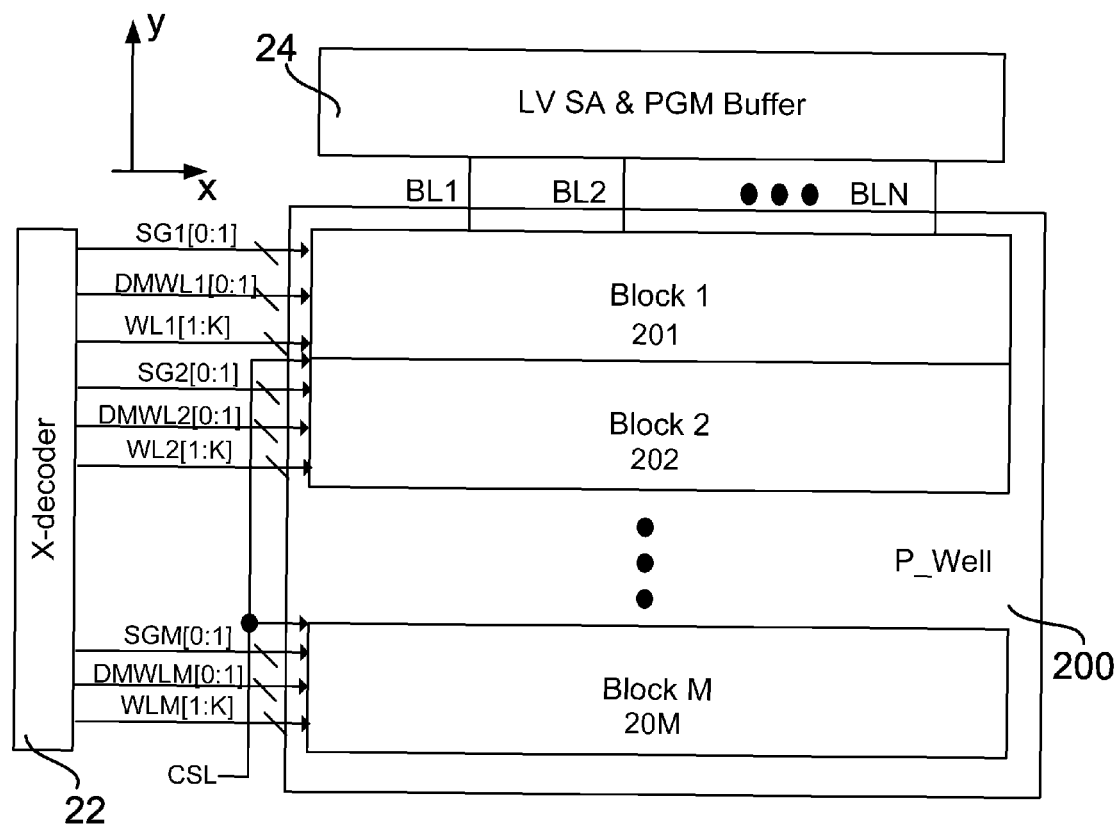
FIG. 2 is a schematic block diagram of a typical NAND flash memory chip comprising of M NAND memory blocks (of FIG. 1), an X-decoder, and a LV SA (Sense Amplifier) and LV PGM buffer (Program page buffer) according to prior art.

FIG. 2 is a schematic block diagram of a typical NAND flash memory chip comprising of M NAND memory blocks, an X-decoder, and a LV SA (Sense Amplifier) and PGM buffer (Program page buffer) according to prior art. Again, presenting this traditional NAND flash memory chip block diagram is merely used as part of an inventive process as described below. As seen, all M NAND memory blocks are formed in an array 200, and the detailed circuit of each memory block (201 for Block 1 through 20M for Block M) has been shown in FIG. 1. The array 200 of NAND memory blocks is formed on the same TPW region within the same DNW region on a common P-substrate with one common source line CSL and M sets of separate K WLs connected to outputs of an X-decoder 22 and M sets of dual SG lines along with N BLs (BL1 through BLN) all connected to outputs of a LV SA and PGM buffer 24. Each block shares the same N BLs. The X-decoder 22 is situated at the left (in x-direction) of the NAND array 200. The LV SA and PGM buffer 23 is situated at the top (in y-direction) of the NAND array 200.

Any one of the M sets of word lines WLM contains a pair of dual SG lines, denoted as SGM[0:1] and K WLs, denoted as WLM[1:K], respectively corresponding to a NAND block 20M and running in x-direction to connect to the outputs of the X-decoder 22. All N BLs are running in y-direction to connect all the M blocks of a NAND string (see 10 of FIG. 1). All transistors in the NAND string in the M blocks are formed within the same TPW region within the same DNW region on top of the common P-substrate.

During a erase operation, only the NAND transistors in the NAND strings in one selected block is to be erased to reduce a threshold voltage level $V_t$ to a negative value of –2.0 V and the $V_t$s of the NAND cells in the remaining strings in the M–1 unselected blocks should not be disturbed or affected. Before the erase operation being executed, the input N bits of incoming page data are stored in the LV SA & PGM buffer 24 first. The details of the traditional NAND operations can be referred to many published papers and patents and would not be re-explained here again to simplify the description as part of inventive process for disclosing embodiments of the present application.

Figure 3:
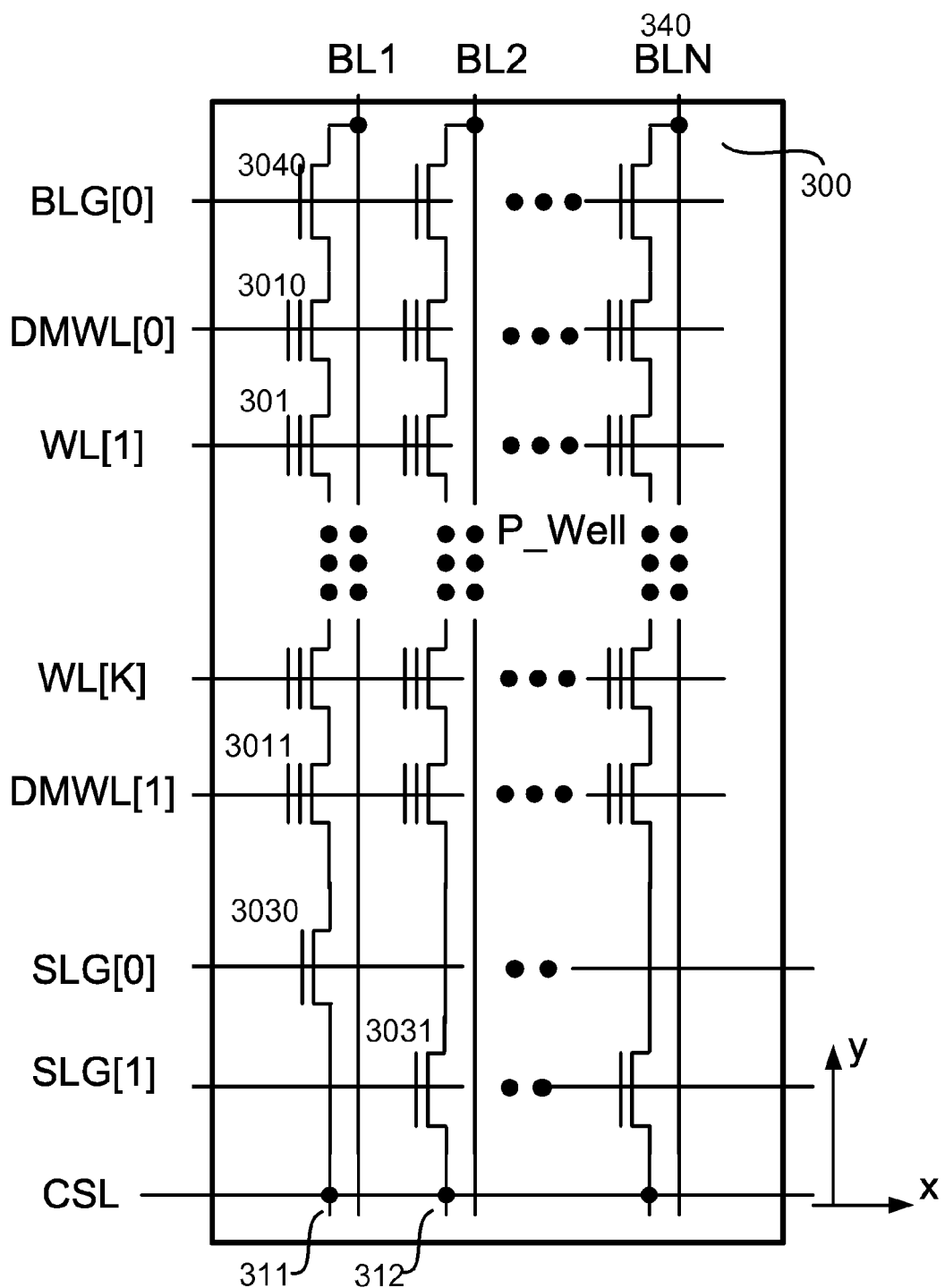
FIG. 3 is a schematic diagram of a NAND flash memory block according to an embodiment of the present invention.

FIG. 3 is a schematic diagram of a NAND flash memory block according to an embodiment of the present invention. This diagram is merely an example, which should not unduly limit the scope of the claims herein. One of ordinary skill in the art would recognize other variations, modifications, and alternatives. Basically, like the conventional NAND memory block shown in FIG. 1, the whole NAND transistors and SG transistors in the same NAND block 300 are still formed on a same TPW region within a same DNW region on a common P-substrate. Each NAND string 311 in the block 300 comprises K basic 2-poly floating-gate NMOS NAND transistors 301 connected in series with top and bottom dummy transistors 3010 and two 1-poly NMOS SG transistors 3040. Particularly the bottom 1-poly NMOS SG transistor is specifically denoted as one odd-column SG transistor 3030 and one even-column SG transistor 3031 respectively corresponding to an odd-column string 311 and an even-column string 312. Two dummy transistors 3010 (top) and 3011 (bottom) are the same type as the 2-poly floating-gate NMOS NAND cell transistors 311.

A major change is included in this circuit according to an embodiment of the present invention compared to a NAND block in prior art (FIG. 1) is to modify the bottom string decoder into odd (O) and even (E) string decoders respectively connected to the corresponding 1-poly NMOS SG transistor 3030 and 3031, both coupled their source nodes to the common source line CSL and their drain nodes coupled to the local source lines of respective odd and even-column strings 311 and 312.

Like the conventional NAND memory block, the whole NAND transistors, a top SG transistor and a bottom divided SG transistor in the same NAND block 300 are still formed on the same TPW region within the same DNW region on the common P-substrate. As compared to the conventional NAND, it also has same number of K regular flash cells 301 with their gates connected WL[1] to WL[K] and The two dummy cells respectively connected two dummy WLs such as DMWL[0] and DMWL[1]. The dummy cell transistor has same gate length as the regular cells. Two bottom SG transistors gated with SLG[0] and SLG[1] are substantially the same type of large 1-poly SG transistor gated with BLG on top of the string. The BLG[0] is a first common gate input to a first (or top) row of 1-poly NMOS select-gate transistors for controlling all bit lines of the N string. The SLG[0] is a second common gate input to a bottom half-row (odd-column) of 1-poly NMOS select-gate transistors for selecting odd-column strings and the SLG[1] is a third common gate input to another bottom half-row (even-column) of 1-poly NMOS select-gate transistors for selecting even-column strings.

The reason of using same transistor for regular NAND cell and the dummy is for preventing the Gate-induced $V_t$ shift from happening at regular flash cells on WL[1] and WL[K]. Instead, the $V_t$ shift caused by selected transistors during the string program-inhibit operation would only affect the flash cells on top and bottom WLs, DMWL. As a result, for multi-level (MLC or XLC) NAND program operation, the regular NAND cells $V_t$s are not affected. In this invention, the program-inhibit voltage of ~7.0V is applied to through the CSL to each divided odd or even string.

Figure 4:
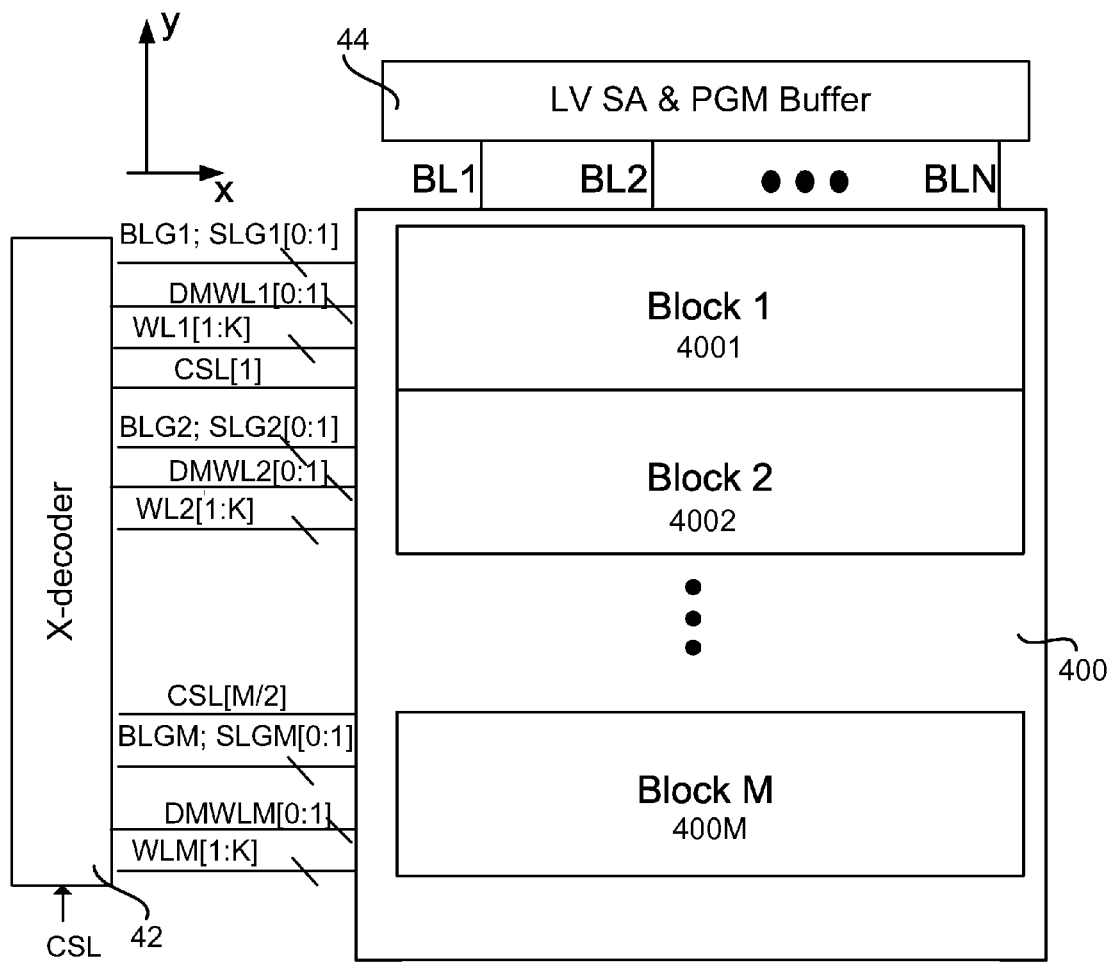
FIG. 4 is schematic diagram of one preferable NAND flash memory sector comprising of M NAND memory blocks sharing N Global bit lines according to an embodiment of the present invention.

FIG. 4 is schematic diagram of one preferable NAND flash memory block array comprising of M NAND memory blocks sharing N Global bit lines according to an embodiment of the present invention. This diagram is merely an example, which should not unduly limit the scope of the claims herein. One of ordinary skill in the art would recognize other variations, modifications, and alternatives. As shown, the whole NAND block array 400 includes a series of M NAND blocks sharing a common TPW region and commonly N numbers of global bit lines, BL1 through BLN. The M and N are serial number and typically an even number greater than 2. Each NAND block 4001 through 400M is substantially the same as illustrated in FIG. 3. Along the x-direction, any block 400M includes K pages associated with K word lines (denoted as WLM[1:K]), two dummy cells for each string respectively associated two dummy WLMs (denoted as DMWLM[0:1]), a top string decoder BLGM, and a pair of bottom string decoders SLGM[0:1], all correspondingly connected to row-data outputs from an X-decoder 42. Additionally, two neighboring blocks are configured to share one common source line (CSL). For M NAND blocks, there are M/2 CSL lines connected to the outputs from the X-decoder 42. In a specific embodiment, the bottom decoders SLGM[0:1] are a divided string decoder that intends to divide all N strings to odd strings and even strings. Along y-direction, all blocks in the block array 400 includes N global bit lines BL1 through BLN connected to a LV SA and PGM buffer 44 configured to supply a low voltage Vdd for bit line status control. One object of the present invention is to utilize a shielding effect provided by the alternating odd and even NAND strings in a block to initiate and retain pre-charged program-inhibit voltages without being mistakenly discharged to prevent programming error.

During the program operation the program-inhibit voltage of around 7.0 V comes from the CSL gated by the selected SLGM[0] and SLGM[1] to the selected local source lines of odd and even NAND strings to inhibit the unselected cells from getting programmed to keep those cells' threshold voltage level $V_t$ unaltered after program operation.

Figure 5:
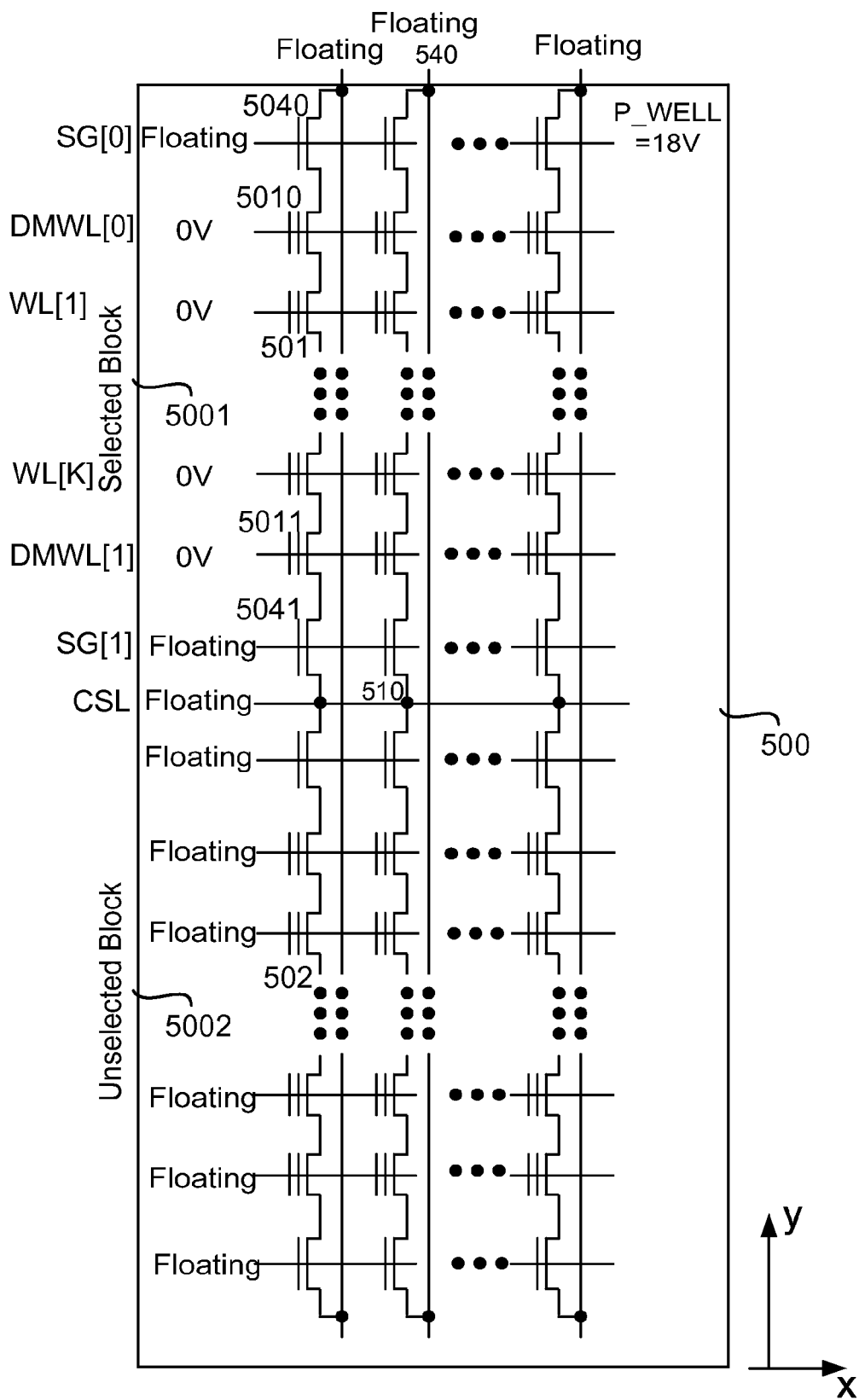
FIG. 5 is a schematic diagram of a partial NAND memory sector with a set of bias voltage conditions for block erase operation according to prior art.

FIG. 5 is a schematic diagram of a partial NAND memory sector with a set of voltage biased conditions for block-erase operation according to prior art. Again, presenting this traditional set of voltage biased conditions for block-erase operation is merely used as part of an inventive process. As seen in FIG. 5, a typical set of voltage biased conditions assigned to the WLs, BLs, CSLs and SGs, TPW (triple P-well region) of a selected block and remaining unselected blocks within a typical NAND memory sector 500 of prior art for FN channel erase operation. The whole selected TPW region (of the sector 500) is coupled to a HV VPP voltage ranging from 18V to 20V, along with all the selected WLs (including dummy WLs) in one selected block 5001 coupled to 0V for performing block-erase operation based on proper FN-tunneling effect. During the erase operation the common source line CSL 510 and the gates of two SG transistors 5040 and 5041 are in floating states. All BLs 540 in y-direction for each of all memory strings are left floating to allow HV (18~20V) of the TPW region to establish the FN-tunneling effect. For the remaining unselected blocks 5002, the gates of the SG transistors are left at floating states as well as all the unselected WLs are left floating to avoid erase operation, even though these blocks (5002) are subjected to the same HV of the common TPW region as the selected block 5001.

In order to save the block silicon area, all current NAND blocks within the same sector are formed in same TPW region and same DNW region. But in common NAND spec, the erase size is defined as one vertical block with a memory density up to 4 Mb. Therefore, when one small NAND block is erased, the $V_t$s of the NAND cells in the remaining blocks within the same sector 500 have to remain unaltered or disturbed.

In FIG. 5, the top block 501 is selected for erase operation in this NAND sector 500. Since the erase operation needs to apply a 18~20V to the common TPW region and VDD to the common DNW region, therefore all NAND cells 501 in the selected block 5001 with WLs coupled to 0V within the same TPW region will be erased. But those cells 502 in the unselected blocks 5002 with floating WLs would not be erased due to the TPW high voltage (~+20V) would couple into the floating WLs. This NAND block-erase approach to selectively erase only the top block 5001 is to ensure that only those NAND cells 501 have the 20V drop across the poly2-gate and the TPW region. For the rest of NAND cells 502 in the unselected blocks 5002 in either x-direction or y-direction, their poly2-gate and the TPW region have to be maintained a same voltage level without any drop to eliminate any fault erase due to FN-tunneling effect.

In order to correctly achieve the desired erase on the selected block, the WLs of the selected top block 5001 are held at 0V but the WLs of unselected blocks 5002 are left floating. When the common TPW is ramped to ramped to +20V, the unselected WLs of unselected blocks 5002 would be also coupled to same +20V. As a result, the unselected NAND cells 502 of the unselected blocks 5002 within the same string would not be erased, thus the NAND cell's $V_t$ remain unchanged.

On the contrary, since the gates of selected NAND cells 501 are held at a fixed 0V, thus a 20V voltage drop between their poly2-gates and the TPW bulk occurred during the erase cycle. As a result, the selected NAND cells 501 in the selected block 5001 within the selected NAND sector 500 would all are subjected to a FN-tunneling effect and get erased to a desired $V_t$ value of −2.0V. Typically, NAND cells' $V_t$s have to perform the erase-verify after the erase operation to ensure all the NAND cells' $V_t$s of all NAND strings in the selected block 5001 are all decreased below the desired value of −2.0V after about 2 mS erase time.

Figure 6:
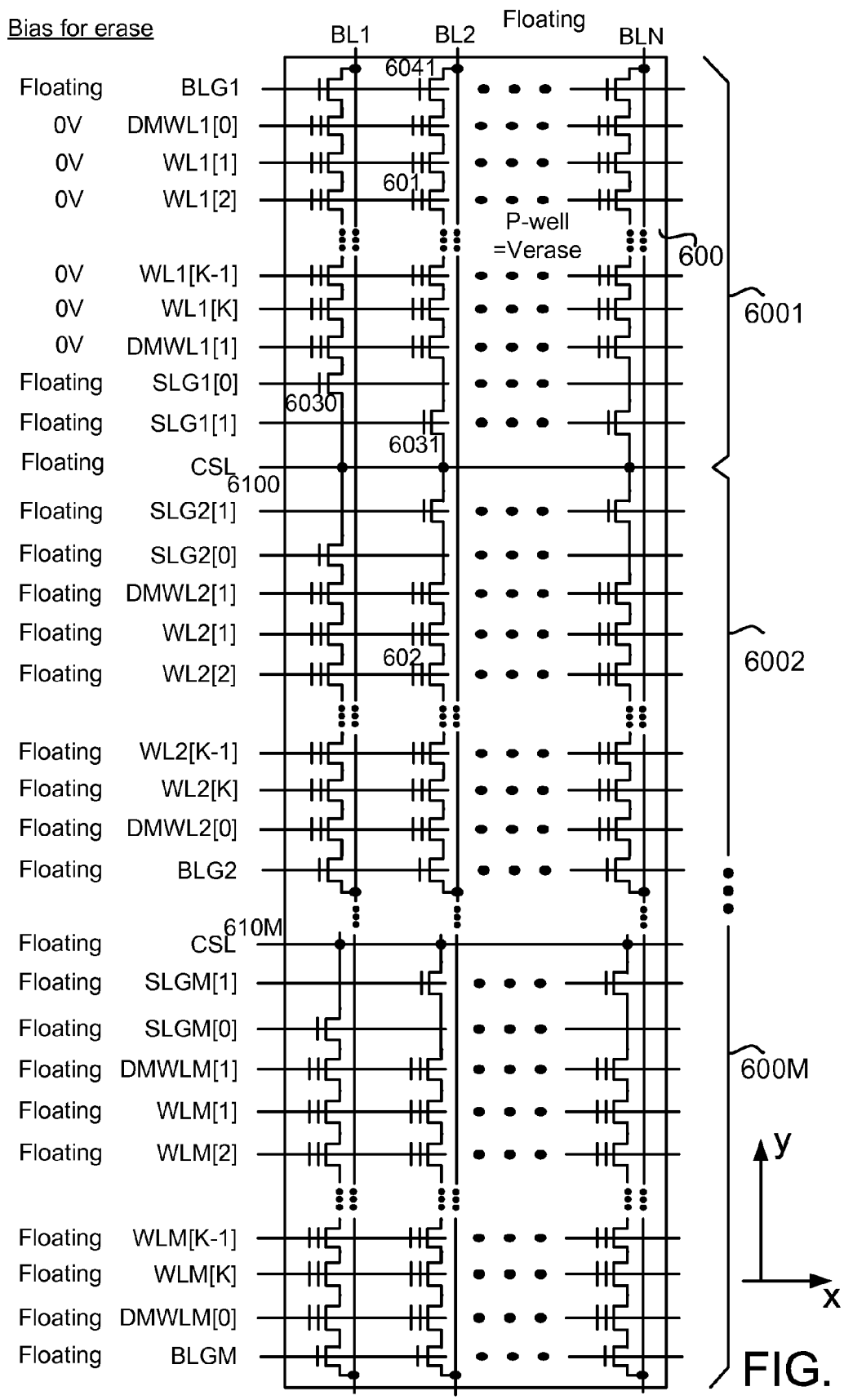
FIG. 6 is a schematic diagram of a NAND memory sector with a set of bias voltage conditions for block erase operation according to an embodiment of the present invention.

FIG. 6 is a schematic diagram of a NAND memory sector with a set of bias voltage conditions for cell erase operation according to an embodiment of the present invention. This diagram is merely an example, which should not unduly limit the scope of the claims herein. One of ordinary skill in the art would recognize other variations, modifications, and alternatives. Similar to the prior art mentioned in FIG. 5, in one selected block 6001 the whole common P-well region is coupled to a HV Verase level of 18V~20V, along with all the selected WLs including dummy WLs being coupled to 0V for proper FN-tunneling effect. All the unselected WLs in the multiple unselected blocks 6002 through 600M are left floating to avoid erase operation. While changes of the voltage biased conditions associated with the NAND memory sector in erase operation according to the embodiment of the present invention are disclosed in detail below.

In FIG. 6, the top block, the block 6001, of the NAND sector 600 is the selected block, and the remaining blocks 6002 through 600M below are the non-selected blocks. The NAND sector 600 performs an erase operation. As like the prior art NAND, the threshold voltage level $V_t$s of the selected flash cells 601 in block 6001, are decreased to be below −2.0V after the FN channel erase operation which may take about 2 mS as seen in many existing NAND spec. To erase the NAND cells 601 in the block 6001, all WLs including two dummy word lines DMWL1[0] and DWWL1[1] in the block 6001 have to be coupled to 0V, while the remaining WLs of unselected blocks 6002 through 600M are kept at floating states. Each block, e.g, 6001 or 6002, has employed a divided bottom decoder to provide divided local source lines for odd and even strings. But for block erase operation, all BL-select for bit lines and SL-select gates for source lines are at floating states except the word lines for to-be-erased cells 601. All bit lines (BL1 through BLN), CSL 6100, and gates of top SG transistors 6041 and bottom SG transistors 6030, 6031 are all left floating for every block. When the common P-well region is coupled and ramped to Vrease=18~20V against the WL voltages, the NAND cells 601 in the selected block 6001 would get erased due to the electrical field across the poly2-gate to common P-well region maintained at ~20V. As a result, after the erase operation in about 2 mS, all NAND cells' $V_t$s should be below −2.0V. At this time, erase verification for each cell is followed. But the values of $V_t$s of those NAND cells 602 in the remaining blocks 6002 through 600M in the sector 600 would remain unaltered due to a coupling effect (the poly2-gate on WL would have the same voltage as the common P-well region is applied at ~20V). Thus no electrical field is strong enough to induce any FN tunneling effect. In order to protect over the other transistors formed in the same sector, their gates should be left floating as specified in FIG. 6 of the present invention.

To erase any block in the remaining unselected blocks, the same procedures applied to Block 6001 can be repeatedly applied to any selected one and to achieve the same erased $V_t$s for all cells therein after the erase operation. The erase procedure can go on one block by one block until all blocks in the selected sector is fully erased and passed with the erased verification. In common NAND spec, a random block is selected to be erased.

Since the top and dummy flash transistors are same as regular NAND flash transistors with same channel length and width, these dummy flash transistors within the selected block can be erased simultaneously with the regular flash cells. Thus, their TPW and WL gate voltage are kept to 0V as the selected WLs in the selected block and floating as the unselected WLs in the unselected Blocks. As a result, the $V_t$s of the dummy flash transistors can be controlled as well as the regular flash NAND cells. The details of erase operation for dummy flash cells are skipped here without affecting the description of the whole patent.

FIG. 7 is a table listed a set of bias voltage conditions for erase operation of a selected block according to an embodiment of the present invention. As shown, the bias voltage conditions for all the operation data lines in x-direction and y-direction are summarized for performing erase operation for a selected block in a NAND memory sector. For example, the NAND memory sector is a selected sector 600 as shown in FIG. 6. For the selected block, all X-decoder lines includes BLG (top SG decoder), first dummy DMWL[0], all K word lines WL[1] through WL[K], second dummy DMWL[1], bottom divided decoder SLG[0] and SLG[1], and CSL. All WLs including two dummy WLs are coupled to 0V. All other X-decoder row-data lines are left at floating states. For the unselected blocks, All X-decoder lines are left at floating states. For the whole memory sector all bit lines BL1 through BLN are left at floating states. The erase voltage level is applied to the common P-well region at 18~20V.

Figure 8:
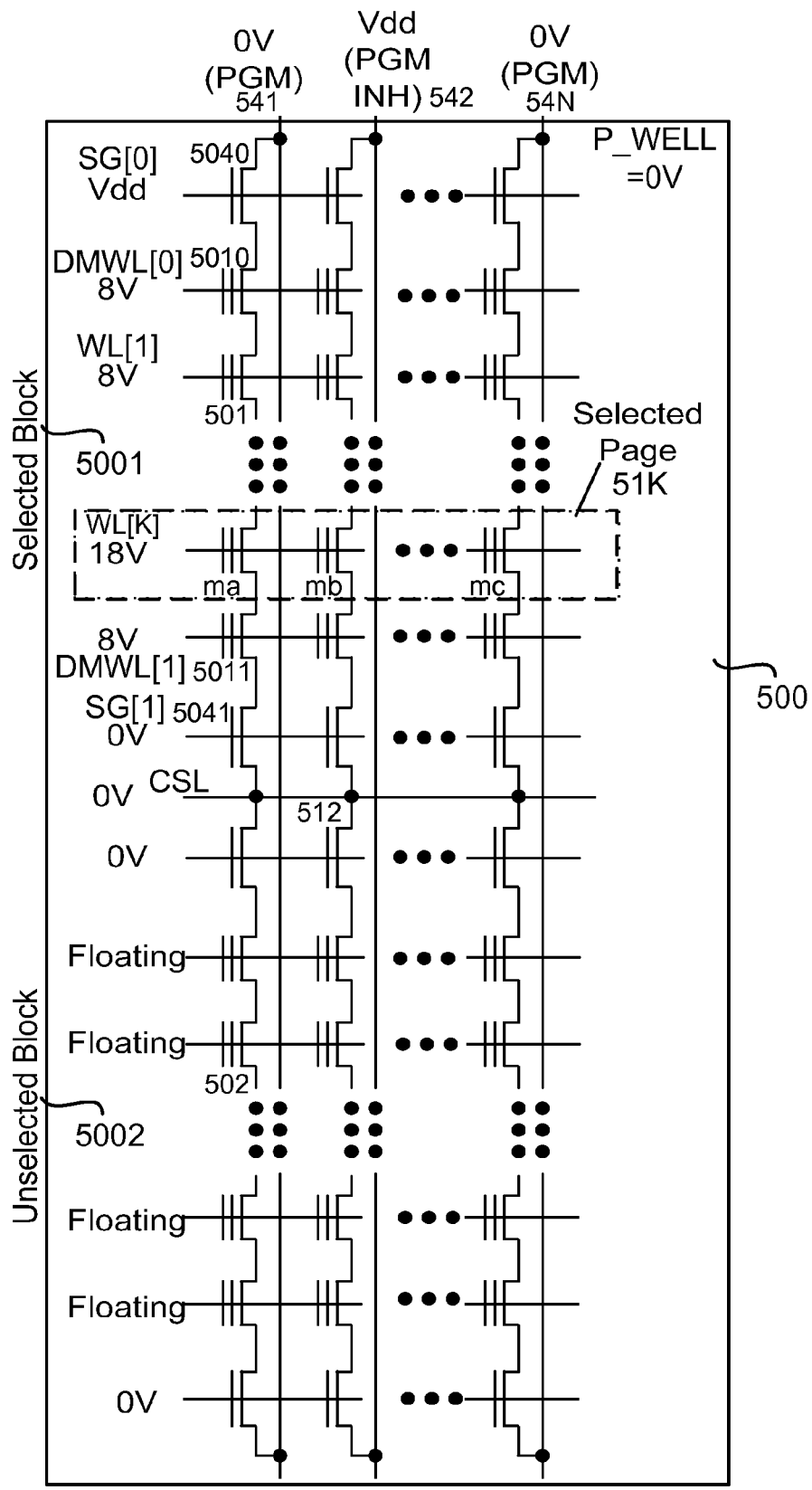
FIG. 8 is a schematic diagram of a partial NAND memory sector with a set of bias voltage conditions for full-page program operation according to prior art.

FIG. 8 is a schematic diagram of a partial NAND memory sector with a set of voltage biased conditions for full-page program operation according to prior art. Again, presenting this traditional set of voltage biased conditions for full-page program operation is merely used as part of an inventive process. As seen in FIG. 8, a typical set of preferable voltage biased conditions is assigned to the selected and unselected WLs, BLs, CSLs and SGs, TPW of the selected block 5001 within a typical NAND memory sector 500 in the preferable FN channel full-page program operation. In this prior art example, the selected page 51K in the selected block 5001 is marked with its gate of the WL (WL[K]) coupled to a HV programming voltage at 18V to 20V, while the remaining WLs in the selected block 5001 are all coupled to 8V to 10V along with the gate SG[0] of top SG transistor coupled to Vdd but the gate SG[1] of the bottom SG transistor coupled to 0V. Normally, for 1.8V device, Vdd range is 1.6V~2V. And, for 3V device, Vdd range is set as 2.7V~3.6V. The TPW voltage is biased at 0V with Deep N-well region biased at Vdd on a P-substrate at ground reference voltage 0V. All the NAND cells 502 in the unselected blocks 5002 are held floating except the gates of their corresponding top and bottom SG transistors are all tied to 0V.

The program operation according to the prior art uses the coupling effect from Poly2-gate to the NAND cell's channel in the selected page 51K. The selected cell ma has its BL 541 being coupled to 0V as a programming voltage setting, while a Vdd level is applied to the selected BLs 542 of the un-programmed cells mb as a program-inhibit voltage setting to shut off the leakage from the channel of the corresponding cell mb to the corresponding BL and/or SL. As a result, the effective program-inhibit voltage can be produced through the Poly2-coupling effect. The detail is not to be further explained here and can refer to the published papers and patents. Using the dynamic coupling effect to produce the program-inhibit voltage in the selected un-programmed cells' channels in the selected strings is very popular in NAND design.

Although the program-inhibit voltage at the channel of the un-programmed cell mb is around 7V, the BL voltage required to produce this inhibit voltage just requires Vdd, which is a low voltage. As a result, today's NAND design using the coupling-generated program-inhibit voltage requires only Vdd or VSS in all BLs. Thus, the SA and PGM buffer does not need to generate any Inhibit HV. Therefore, a small LV SA and PGM buffer is built in all NAND design today for area reduction.

In the above biased conditions, the NAND cells ma through mc in the selected page 51K of the selected block 5001 would get programmed (except the cell mb inhibited via a global BL voltage at Vdd level) and later being performed program verification. Once pass the program verification, the $V_t$ level of selected NAND cells would be programmed to desired positive $V_t$ levels. In a single-level cell (SLC), the programmed $V_t$ is referred as $V_{t1}$ of value around +2.0V. In a multi-level cell (MLC), then the 3 positive $V_t$s would be $V_{t1}$ of 1.0V, $V_{t2}$ of 2.5V and $V_{t3}$ of 4.0V. The erased $V_t$ level is $V_{t0}$ at a value below −2.0V initially.

As pointed out above, the traditional NAND flash memory uses the dynamic coupling effect to generate the dynamic program-inhibit voltage via local boosting which is a being extensively used in NAND products. But when NAND cells are scaled down to below 20 nm, the above so-called local-boosting program-inhibit voltage would not work precisely as desired. That is why we saw, after NAND getting below 30 nm, more erroneous bits happen and require more powerful error correction codes (ECC) algorithm to fix it. For NAND memory cells in 30 nm node scale, the ECC may need to correct 25 bits in each read data string. But down to 20 nm node scale, more than 30 bits may need to be corrected per data string. This is due to that these locally-boosted 7V program-inhibit voltage would make a punch-through in the adjacent cells of the selected cell in the selected string. Due to the punch-through effect, the coupling 7V would be lowered below even 4V due to a charge sharing effect among the selected cells and top and bottom adjacent non-selected flash cells. Therefore, an improved NAND design with non-boosting program-inhibit scheme is desired and becomes an object of the present invention. More details about a preferable novel page program operation that is performed in unit of half-page through a non-boosting program-inhibit scheme in NAND design can be found throughout the specification and particularly below.

In a specific embodiment, the whole program operation is divided into three cycles to perform the half-page program operation with non-boosting program-inhibit scheme in a preferable NAND memory sector. A first cycle is a pre-charge cycle, which sets up a key difference between this new NAND design and conventional NAND in page-program operation, that is to generate the program-inhibit voltage in both selected and unselected BLs associated with odd and even strings in a selected page of a selected block. A second cycle is a data-setting cycle, which determines a selective discharge of the selected BLs controlled by using bottom divided decoder to separate out odd and even strings and open top BL-select SG transistor to allow the local BL to access corresponding GBL selectively biased to initiate the discharge of the selected local BL. Final cycle is a program cycle, which still apply a high bias voltage Vpgm to the selected WL to program into the selected cell which has right program local bit line voltage level discharged to 0V in previous cycle, with its neighboring unselected BL retained at pre-charged program-inhibit voltage level to provide shielding effect for preventing drag the unselected BL voltage level to low.

The program-inhibit voltage of about 7.0V of this new NAND array architecture of the present invention is applied via a static pre-charge approach. In a specific embodiment, this program-inhibit voltage is generated from the on-chip charge-pump circuit and is supplied to the selected common node of CSL and gated by the divided decoder SG transistors to source lines of either odd-column strings or even-column strings running vertically. Then through the decoders and proper circuit designs, this program-inhibit voltage level Vinh will be forwarded to the right unselected strings in the selected block to avoid undesired program operation. The details would be further described below in several examples.

Figure 9A:
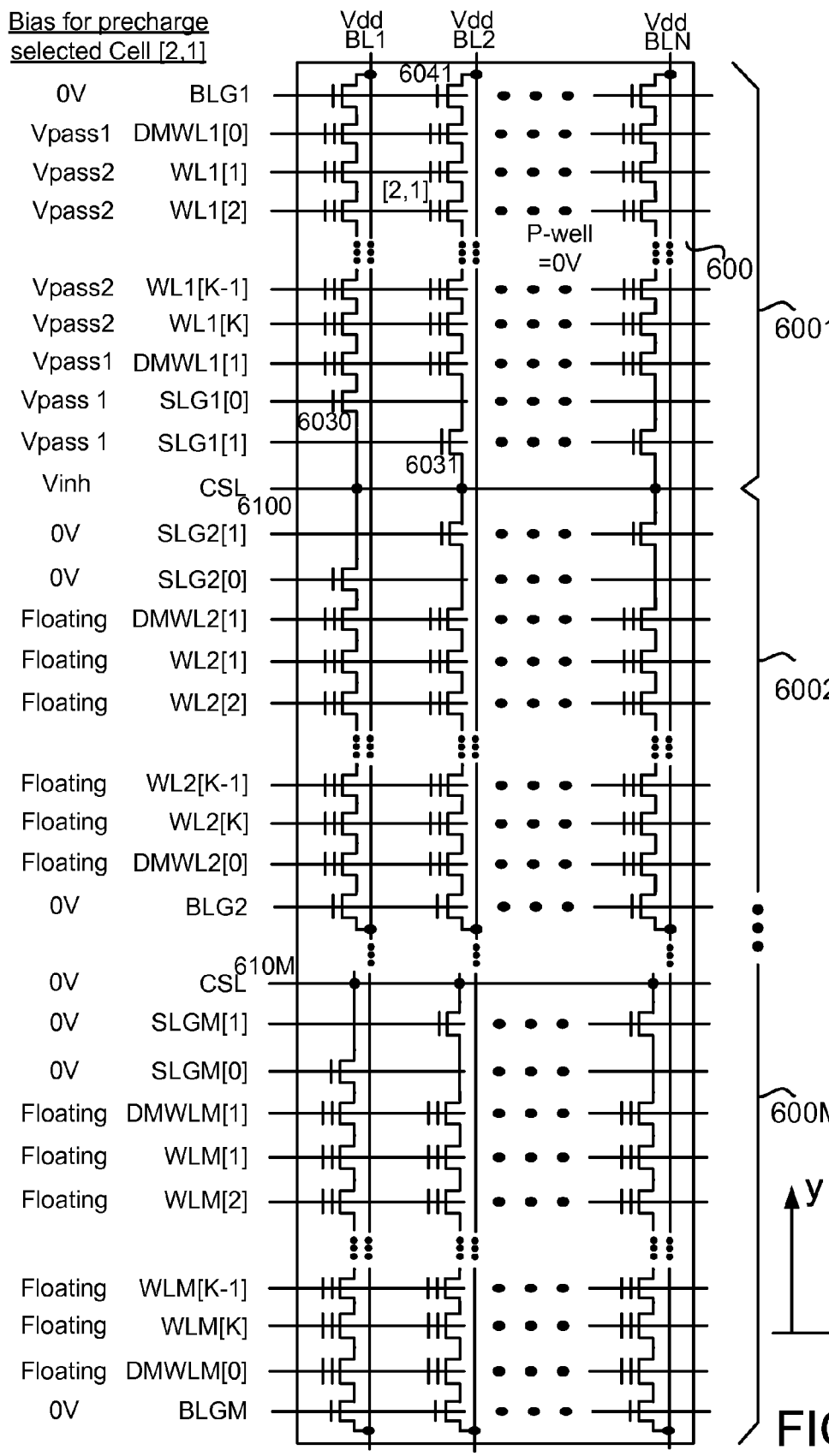
FIG. 9a is a schematic diagram of a NAND memory sector with a set of bias voltage conditions during a pre-charge period of half-page program operation of a selected cell according to an embodiment of the present invention.

FIG. 9a is a schematic diagram of a NAND memory sector with a set of voltage biased conditions during pre-charge period of half-page program operation according to an embodiment of the present invention. This diagram is merely an example, which should not unduly limit the scope of the claims herein. One of ordinary skill in the art would recognize other variations, modifications, and alternatives. As shown, a preferable set of voltage biased conditions is assigned to the selected and unselected WLs, dummy WLs, BLs, CSLs and BLGs, SLGs, and P-well of a selected block 6001 and remaining unselected blocks 6002 through 600M within a NAND memory sector 600 during a first program cycle, which is cited as pre-charge period. With an implementation of bottom divided string decoder using two separate half-row SG transistors 6030 and 6031 to act as source line isolation devices to divide each page into two halves. The first half is associated with odd SLs of all odd-column strings and the second half is associated with even SLs of all even-column strings. The gates of these two groups are separated to connect SLG[0] and SLG[1] from X-decoder but their source nodes are connected to a common source line CSL 6100. Now each single page of a selected block can be programmed in unit of half-page. The pre-charge cycle has to be performed in unit of half-page of the present NAND invention.

In an embodiment, the program operation in a NAND memory block is executed sequentially cell-by-cell from cell 1 through cell K and string-by-string for each selected BL from BL1 through BLN in unit of half-page of either odd or even strings. Although the program operation is divided into three cycles, the operation scheme would be the same cell-by-cell and string-by-string (in unit of half-page) sequential basis for each cycle. During the pre-charge cycle, all odd and even local bit line BLs and local source line SLs are preferably pre-charged to a program-inhibit voltage level through a sequential cell-by-cell process from cell 1 through cell K in a string associated with a selected BL.

In a preferable NAND memory sector 600 shown in FIG. 9a, any selected cell in the selected block 6001 is denoted as Cell[BL,WL]. For example, a first cell of a string with a first even-column bit line (BL2) is Cell[2,1]. As the pre-charge cycle starts, all global BLs are biased to Vdd as the common P-well is grounded to 0V and all X-decoder row-data lines are biased based on the selection of Cell[2,1] to perform the programming operation is shown as a list in the left side of FIG. 9a, which is also summarized in a table shown in FIG. 10a. As shown in FIG. 9a, the top block 6001 is a selected block, BLG1 is coupled to 0V to turn off the top BL-select transistor, CSL is applied to the program-inhibit voltage level Vinh of 6~8V, SLG[0] and SLG[1] are both coupled to a first pass voltage level Vpass1 of 9~11V. Then a second pass voltage level Vpass2 of 6~8V is applied to the selected WL of cell[2,1]. The word line just one ahead of the selected WL1[1] is applied to the first pass voltage level Vpass1. For the selected cell[2,1] the WL just one ahead of it is the first dummy WL DMWL1[0]. For other WLs further ahead in the string with BL2, which are supposed to be handled in one or more previous cycles, their bias voltages are dropped to a Vdd level from the Vpass1 level. In the specific case shown in FIG. 9a, there is no other WLs further ahead of the first dummy WL. For rest WLs after the selected WL1[1], which are supposed to be programmed in subsequent cycles, the bias voltages applied to all those WLs will be the Vpass2 level except that the Vpass1 level is applied to the second dummy WL at the end of the string (in this selected block 6001). At the same time, all unselected blocks 6002 through 600M in the sector 600 will be biased accordingly as seen in the left of FIG. 9a. In particular, all WLs including DMWLs are left at floating and SG gates are turned off and CSLs (not shared with the selected block) are tied to 0V. These bias conditions are progressively applied for next selected cell[2,2], and through more to cell[2,K−1], and cell[2,K], as well as bias conditions for CSL, BLG, SLGs, and all global BLs of the selected block and unselected blocks and summarized in table in FIG. 10a. These special WL bias conditions with various pass voltage levels are related to a gate-induced drain lowering effect and designated to prevent hot carrier from generating electron hole pair accelerated by lateral electric field and further causing the inhibited cell to get the charges. Similar bias conditions are applicable for performing a half-page program operation for odd-strings. As all BL-selected transistors are off by biasing BLG=0V while SL-selected transistors are on by biasing SLG[0] and SLG[1] at the Vpass1 level, the common source line voltage applied through the CSL at the program-inhibit voltage level Vinh would not leaked away to global BLs, resulting all local BLs being charged also to the program-inhibit voltage level.

During the preferable pre-charge cycle, the program-inhibit voltage level of 7V comes from CSL through odd and even SL-isolation devices to all local strings of the selected sector and would not leaked away to top GBLs because all BL-selected transistors remain in the shut-off state with BLG set to 0V. This pre-charge cycle time is subject to the capacitance of each NAND string. In this NAND array, it is preferable to have total 256 WLs with one or two dummy WLs on top and bottom in each string at 1× nm node to reduce the overhead of two big select transistors. Thus each string capacitances is less than 0.2 pf when it is around 1× nm. As a result, the PC time for the selected one sector is aimed to be less than 5 μS-10 μS to allow the iterative half-page program and program verification.

At the end of the pre-charge cycle period, the on-chip charge-pump is preferably remaining active so that the program-inhibit voltage level can be well maintained in all selected NAND strings of the selected sector and blocks. After the pre-charge cycle, now the program operation will be immediately moved to the second cycle which is cited as data-setting cycle period.

Figure 9B:
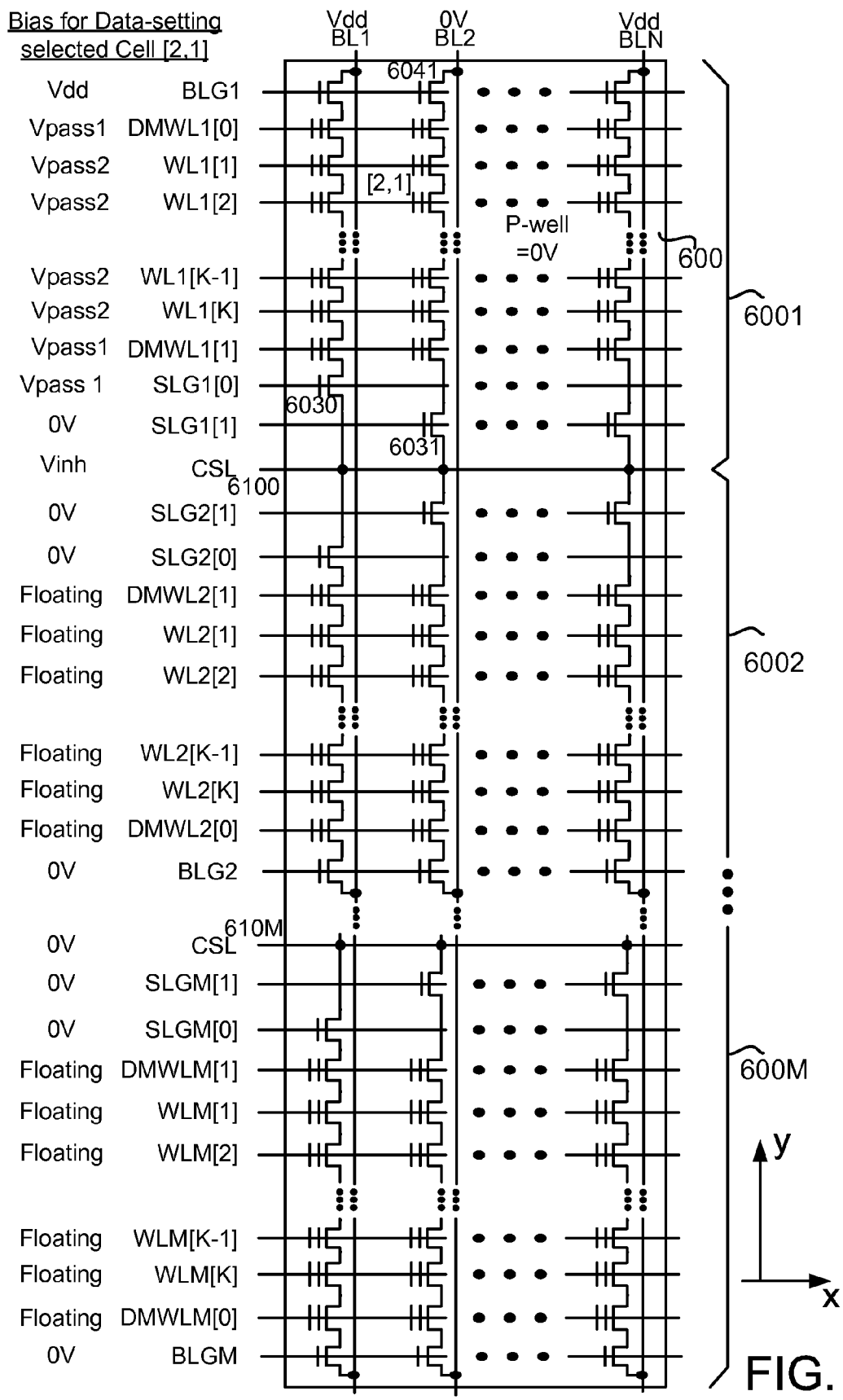
FIG. 9b is a schematic diagram of a NAND memory sector with a set of bias voltage conditions during a data-setting period of half-page program operation of a selected cell according to an embodiment of the present invention.

FIG. 9b is a schematic diagram of a NAND memory sector with a set of bias voltage conditions during a data-setting period of half-page program operation of a selected cell according to an embodiment of the present invention. This diagram is merely an example, which should not unduly limit the scope of the claims herein. One of ordinary skill in the art would recognize other variations, modifications, and alternatives. As shown, a preferable set of voltage biased conditions is assigned to the selected and unselected WLs, dummy WLs, BLs, CSLs and BLGs, SLGs, and P-well of the selected block 6001 and the remaining unselected blocks 6002 through 600M within the NAND memory sector 600 during a second program cycle, which is cited as data-setting period. This cycle has to be performed in unit of half-page program operation according to the present invention.

As explained in FIG. 9a, all local BLs of the strings in the selected NAND block are precharged to PIV during the precharge cycle. Then at the beginning of the data-setting cycle, all channels of the selected NAND strings are still maintained at the program-inhibit voltage level Vinh of ~7V when charge pump was held active and both odd and even selected gates SLG[0] and SLG[1] were in the conduction states. Now the half-page data-setting program operation of the NAND block is followed. In this data-setting cycle, the common P-well region is remained at ground 0V and all the global BL voltages are coupled to Vdd as set in the precharge cycle except the GBL (BL2 in FIG. 9b) associated with the selected string is changed to 0V, by changing the corresponding data pattern stored in the LV SA and PGM buffer from external pins of the present invention. In this case, the cell in a selected page associated with a GBL voltage set to be 0V is selected for programming, while the cells associated with global BL voltages set to be Vdd are selected for un-program.

Since all local BLs are held at the program-inhibit voltage level Vinh in the beginning of this data-setting cycle, thus the selected local BL for program has to be discharged to 0V. This is done by turning on the BL-select SG transistor by biasing BLG to Vdd as the selected global BL is set to be 0V. But in order to discontinue the leakage to the 0V global BL, the corresponding selected local SL connected to the pump of 7.0V has to be disconnected. As a consequence, the gates of all SL-select transistors connected to SLG[1], for performing even-string half-page program operation in the current case, are coupled to 0V so that the selected local BL would be pulled to 0V and non-selected local BLs would be kept at the pre-charged level of 7.0V in half-page without placing any current loading on the pump.

One the contrary, another half-page (with odd-column cells) is still held at the Vpass1 level of ~7.0V because the gates connected to SLG[0] are still coupled to the Vpass1 level and CSL is still held at Vinh of ~7V. Since each selected local BL is sandwiched by two adjacent unselected local BLs which are held at ~7V, so that the selected string's channel voltage would not pulled to low due to coupling effect of the discharge. As a result, the one half-page program can be performed without errors, according to the data pattern stored in the LV SA and PGM buffer.

Using FIG. 9b as an example for programming a selected cell [2,1] in the selected block 6001, the bias conditions are subsequently continued from previous FIG. 9a referring to a pre-charge cycle. The selected GBL is BL2 then the selected half page is associated with even-column string. Bias conditions for all word lines (including dummy WLs) are similar to those in FIG. 9a and can be progressively applied following the listed values in the left of the FIG. 9b. Changed bias conditions only apply 0V to SLG[1] to turn even-string SG transistors off, while keeping SLG[0] at Vpass1 level to always turn on odd-string SG transistors and maintaining CSL at the program-inhibit voltage level Vinh of ~7V. All other bias conditions for unselected blocks remain unchanged. FIG. 10b also summarizes these bias conditions progressively applied for selected cells from Cell[2,1], Cell[2,2], through Cell[2,K-1] to Cell[2,K], as well as bias conditions for CSL, BLG, SLGs, and all global BLs of the selected block and unselected blocks. Other variations in bias conditions can be deduced based on FIG. 10b. As the data-setting cycle completes, all half-page cells in a selected page would have the right program LBL voltage of 0V and right program-inhibit LBL voltage of 7V ready for the programming cycle of program operation.

Figure 9C:
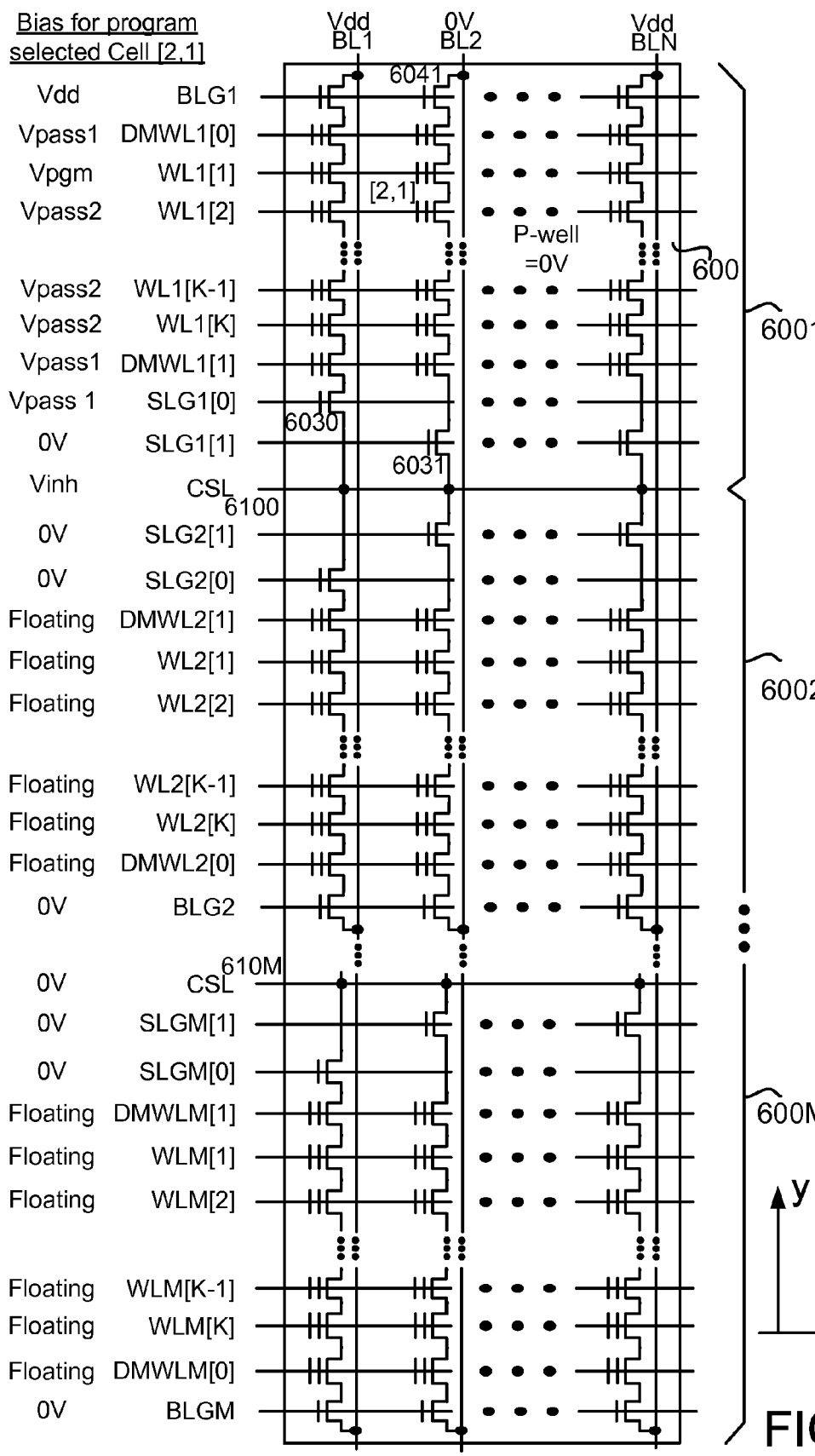
FIG. 9c is a schematic diagram of NAND memory sector with a set of bias voltage conditions during a programming period of half-page program operation of a selected cell according to an embodiment of the present invention.

FIG. 9c is a schematic diagram of a NAND memory sector with a set of voltage biased conditions during programming period of half-page program operation of a selected cell according to an embodiment of the present invention. This diagram is merely an example, which should not unduly limit the scope of the claims herein. One of ordinary skill in the art would recognize other variations, modifications, and alternatives. FIG. 9c shows a preferable set of voltage biased conditions assigned to the WLs, BLs, CSLs and SGs, TPW of the selected block 6001 and the remaining unselected blocks 6002 through 600M within a typical NAND memory sector 600 during the programming cycle of the preferable half-page program operation of the present invention.

Using FIG. 9c as an example for programming a selected cell [2,1] in the selected block 6001, the bias conditions are subsequently continued from previous FIG. 9a and FIG. 9b respectively referring to a pre-charge cycle and a data-setting cycle. The selected GBL is BL2 then the selected half page is associated with even-column string. As the programming cycle starts, the common P-well region is remained at ground 0V and all BL voltages settings remain the same as the data-setting stage. Bias conditions shown in the left of the FIG. 9c and are almost the same for all word lines (including dummy WLs) as those in FIG. 9a and FIG. 9b except that a programming voltage level Vpgm is now applied to the selected WL for programming the selected cell [2,1] which has been determined by the right local BL that has been discharged to 0V during the previous data-setting cycle. Again, a half-page operation is carried out as the bottom decoder has selected the even-column string by setting SLG[1] to 0V but retaining SLG[0] always at high Vpass1 level. So, no coupling effect will be triggered to cause program error in the programmed cell (i.e., cell [2,1] in this case). All other bias conditions for unselected blocks 6002 through 600M remain unchanged. FIG. 10c also summarizes these bias conditions progressively applied for selected cells from Cell[2,1], Cell[2,2], through Cell[2,K-1] to Cell[2,K], as well as bias conditions for CSL, BLG, SLGs, and all global BLs of the selected block and unselected blocks. Of course, the whole program operation scheme can be repeated through the half-page pre-charge cycle, data-setting cycle, and programming cycle on selected cells belonging to odd-column half page by switching the bias conditions for SLG[0] and SLG[1] during the corresponding data-setting and programming cycles. Other variations in bias conditions can be deduced based on FIG. 10c.

In an embodiment, within this half-page programming cycle, 18~20.0V of program WL voltage Vpgm is achieved by ramping the selected WL voltage from an initial value about 8~10V to the final 18~20V for the accurate half-page program according to an embodiment of the present invention. For good control over the NAND cells' $V_t$s in the selected half-page, the selected gate voltage can be gradually increased one pulse by one pulse. The program operation practically is an iterative process. The program time spec is being divided into around 10 pulses with each pulse set to be around 20-25 μS. Whenever the half-page program is performed, a half-page program verification will be performed subsequently. The process will be repeated until the all bits are in half-page being successfully programmed. Then the next half-page program steps will be repeated from FIG. 9a through FIG. 9c until the whole page data being correctly programmed without errors.

Figure 11:
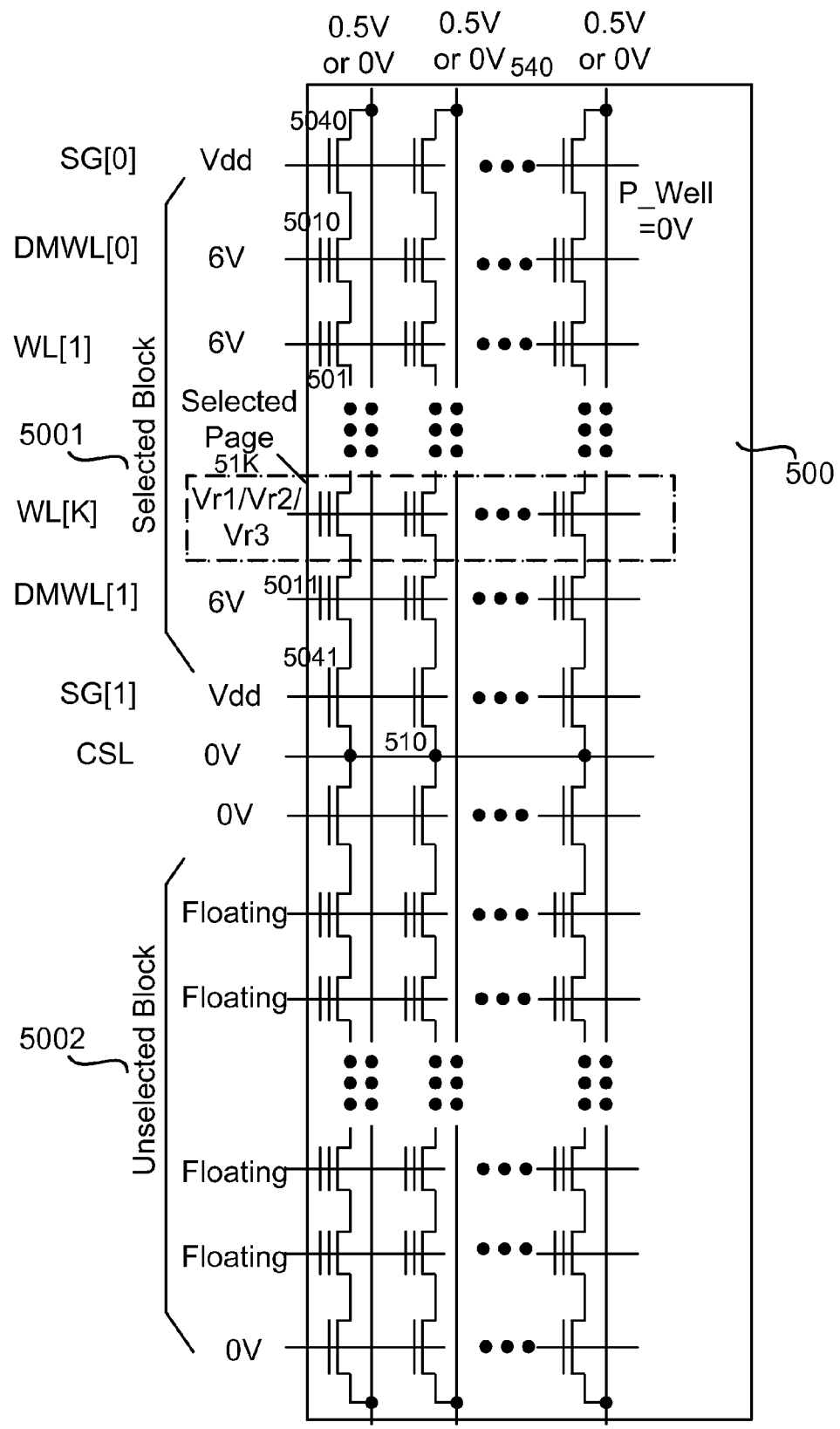
FIG. 11 is a schematic diagram of a partial NAND memory sector with a set of bias voltage conditions for read operation according to prior art.

FIG. 11 is a schematic diagram of a partial NAND memory sector with a set of voltage biased conditions for read operation according to prior art. Further, the presentation of this traditional set of voltage biased conditions for read operation is merely used as part of an inventive process. As seen in FIG. 11, a typical set of preferable voltage biased conditions is assigned to the WLs, BLs, CSLs and SGs, TPW and DNW of the selected block 5001 and the remaining unselected blocks 5002 within a typical NAND memory Sector 500 during the Read operation.

The selected block 5001 in FIG. 11 is the top block in the selected sector 900 and the selected page 901-K is in the middle of the selected NAND string. The NAND string can be made of 32 or 64 NAND cells connected in series. The biased conditions for all BLs are set to be 0.5V initially in the read cycle. The read operation is performed in unit of whole page.

For accurate read each bit in the NAND cell, the selected WL corresponding to the selected page (51K) is coupled to a read voltage $V_r$ and the rest of the WLs in the selected block 5001 are coupled to a same pass-voltage of 6.0V which must be higher than the highest NAND's $V_t$ value. If the NAND stores SLC $V_t$, then one read voltage $V_{r1}$ is required. But if the NAND stores 4 MLC $V_t$ states, then 3 read voltage levels, such as $V_{r1}$, $V_{r2}$ and $V_{r3}$ values, are required to read out the 4 stored MLC values. The selected gate WL voltage is incrementally increased three times of $V_{r1}$, $V_{r2}$ and $V_{r3}$ to read out 3 distinguished $V_t$ values stored in all NAND cells in the selected page 51K. Typically, $V_{r0}$ is 0V initially, $V_{r1}$ is 1.5V and $V_{r2}$ is 2.5V and $V_{r3}$ is 3.5V along with 4 $V_t$ values are set to be $V_{t0}$ of -2V, $V_{t1}$ of 1V, $V_{t2}$ of 2V while the $V_{t3}$ is set to be around 3V.

During the read operation, when the applied $V_r$ value is higher than the stored $V_t$ value, then the selected global BL voltage in all BLs 540 would be discharged to 0V, otherwise the global BL voltage would remain the same initial precharged value of Vdd. The typical page read speed in today's MLC NAND is around 60 μS. For SLC NAND, the page read speed is around 20 μS. The details of NAND read operation can be referred to many published papers and patents and would not be further explained here for description simplicity of the present invention.

Figure 12:
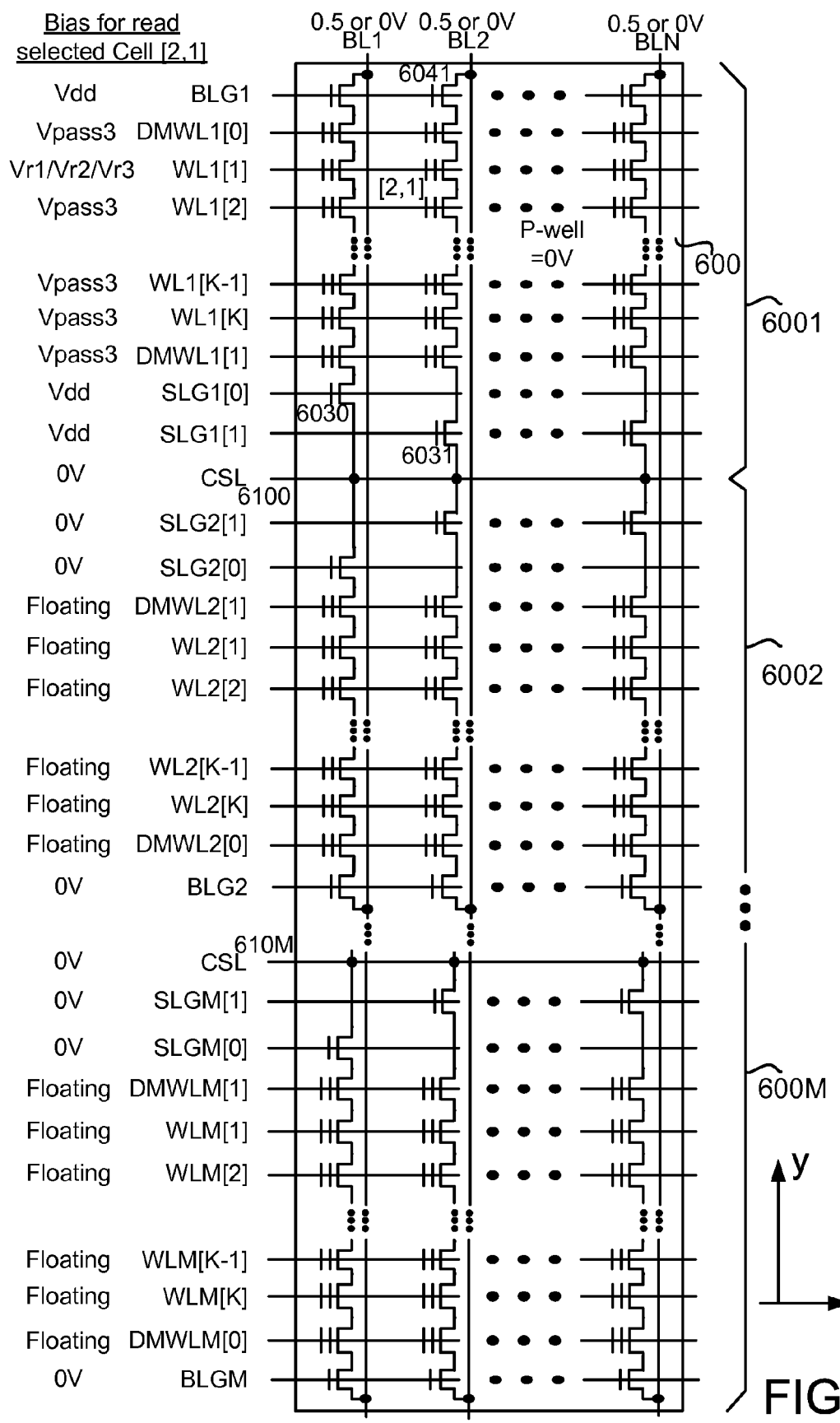
FIG. 12 is a schematic diagram of a NAND memory sector with a set of bias voltage conditions for read operation of a selected cell according to an embodiment of the present invention.

FIG. 12 is a schematic diagram of a NAND memory sector with a set of voltage biased conditions for read operation according to an embodiment of the present invention. This diagram is merely an example, which should not unduly limit the scope of the claims herein. One of ordinary skill in the art would recognize other variations, modifications, and alternatives. As shown, a set of preferable voltage biased conditions is assigned to the WLs, BLs, CSLs and SGs, TPW of the selected block and the remaining unselected blocks within a NAND memory array during the read operation according to an embodiment of the present invention.

One object of this NAND design according to an embodiment of the present invention is to store both SLC and MLC and even XLC for forming an extremely high-density (Hi) NAND. Therefore, the selected WL voltage in read operation has to be coupled to Vr value as conventional NAND explained FIG. 11. The values of Vrn and Vtn of the HiNAND can be set to be the same as the conventional NAND due to the similar NAND string architecture. Therefore, the pass-gate voltage Vpass3 of 5~6V is coupled to all non-selected WLs in the selected string. Both SL-isolation devices 6030 and 6031 have to be held in conduction state with gates SLG[0] and SLG[1] coupled to Vdd. CSL is held at 0V and gates BLG of top BL-selected transistors are also coupled to Vdd to be on conduction state for read sensing. The common P-well region is grounded at 0V. The unselected blocks WL voltages are "don't care" as long as their local BL-selected gates are in non-conduction state (held at 0V) and off from all global BLs assigned to 0.5V or 0V. A set of bias voltage values are listed in the left of the FIG. 12 for read operation for the selected cell [2,1] in the selected block 6001 of the sector 600. FIG. 13 further shows detailed lists of additional WL bias conditions for other selected cells from cell[2,1], cell[2,2], through cell [2,K-1], to cell[2,K], as well as other bias conditions for BLG, SLGs, CSL for the selected and unselected blocks.

For read operation, the selected WL is coupled to a predetermined read voltage level of 2.5 V for 3V Vdd operation. But the unselected M-1 WLs are coupled to 0V to inhibit leakage in the selected BLs coupled to 1V along with 0V coupled to SLs. During read operation in embedded EEPROM application, one byte for 8-bit CPU read, 2-byte for 16-bit CPU read and 4-byte for 32-but CPU read for fast read speed. But in slow 8-pin serial EEPROM design, one bit read is very common to save area and power consumption.

Figure 14:
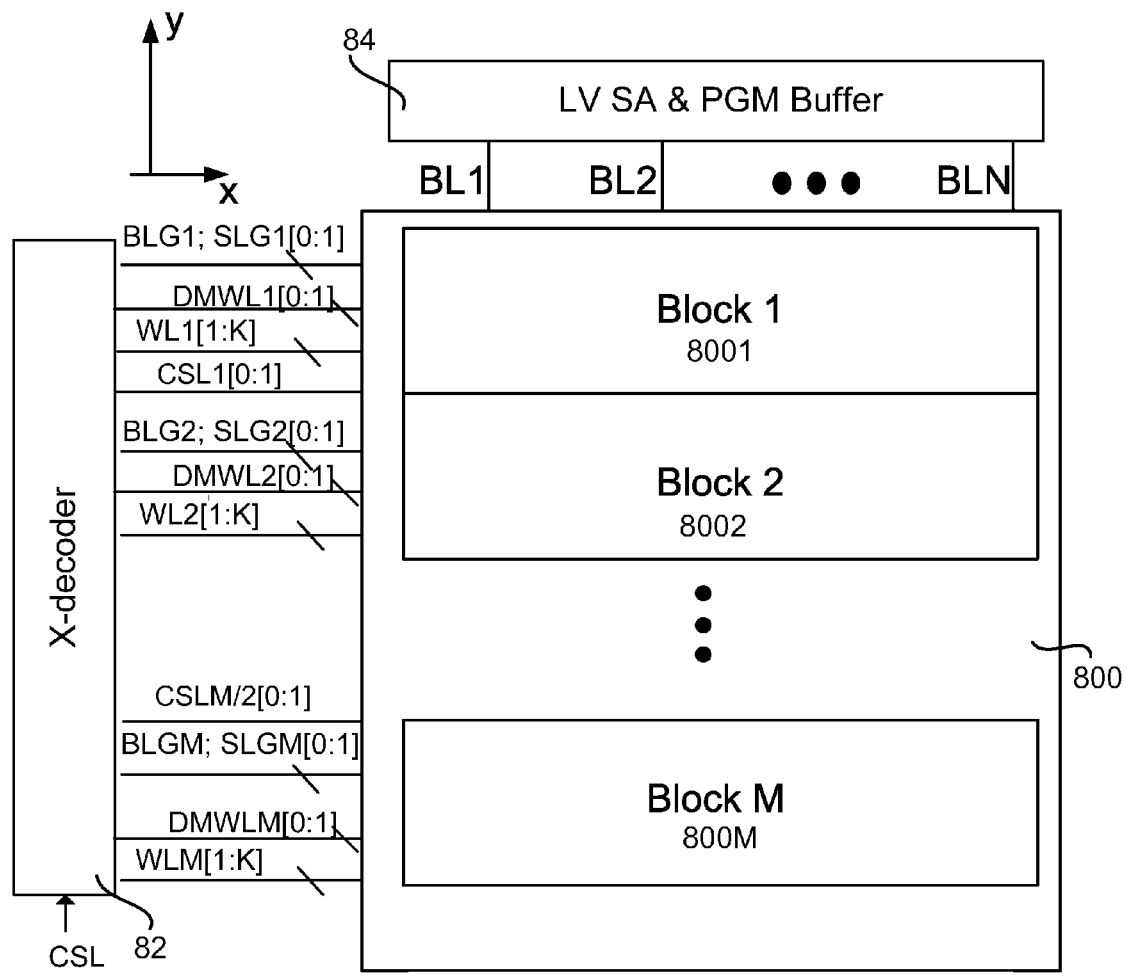
FIG. 14 is schematic diagram of one preferable NAND flash memory block array comprising of M NAND memory blocks sharing N Global bit lines according to an alternative embodiment of the present invention.

In an alternative embodiment, a NAND memory sector contains multiple blocks that share a common P-well region and N global BLs is configured differently with a pair of common source lines connected to an X-decoder for each pair of memory blocks. FIG. 14 is schematic diagram of one preferable NAND flash memory block array comprising of M NAND memory blocks sharing N Global bit lines according to an alternative embodiment of the present invention. As shown, the whole NAND block array 800 includes a series of M NAND blocks sharing a common TPW region and commonly N numbers of global bit lines, BL1 through BLN. The M and N are serial number and typically an even number greater than 2. Along the x-direction, any block 800M includes K pages associated with K word lines (denoted as WLM[1:K]), two dummy cells for each string respectively associated two dummy WLMs (denoted as DMWLM[0:1]), a top string decoder BLGM, and a pair of bottom string decoders SLGM[0:1], all correspondingly connected to row-data outputs from an X-decoder 82. Each page is associated with a WL. In a specific embodiment, the bottom decoders SLGM[0:1] are a divided string decoder that intends to divide all N strings to odd strings and even strings. Each string is associated with a local BL and a local SL. Along y-direction, all blocks in the block array 800 includes N global bit lines BL1 through BLN connected to a LV SA and PGM buffer 84 configured to supply a low voltage Vdd for bit line status control. Additionally, two neighboring blocks are configured to share a pair of common source lines, a first common source line and a second common source line, denoted as CSL[0,1]. The first CSL is configured to couple with the local SLs associated with odd-column strings and the second CSL is configured to couple with the local SLs associated with even-column strings. For M NAND blocks, there are M/2 pairs of CSL lines connected to the outputs from the X-decoder 82. For example, the first two blocks share a pair of common source lines: CSL1[0,1], the next two blocks sharing CSL2[0,1], and last two blocks sharing CSLM/2[0,1]. In a specific embodiment, the two odd/even divided CSLs are provided to reduce a voltage difference between a BL of an odd/even-string and corresponding first/second CSL during program operation. Still a major object of the present invention is to utilize a shielding effect provided by the alternating odd and even NAND strings in a block to initiate and retain pre-charged program-inhibit voltages without being mistakenly discharged to prevent programming error.

Figure 15:
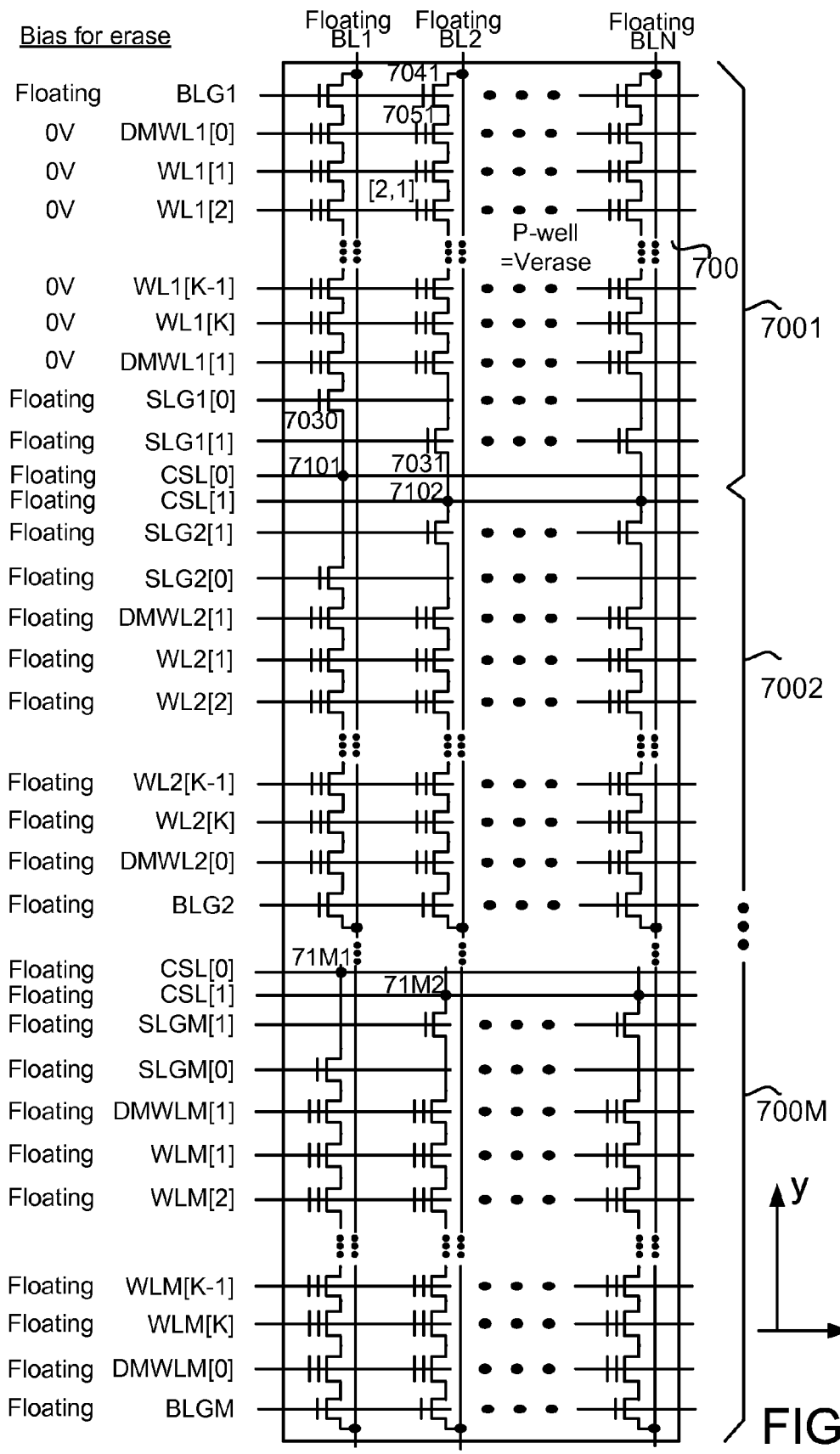
FIG. 15 is a schematic diagram of a NAND memory sector with a set of bias voltage conditions for erase operation of a selected block according to an alternative embodiment of the present invention.

FIG. 15 is a schematic diagram of a NAND memory sector with a set of bias voltage conditions for erase operation of a selected block according to an alternative embodiment of the present invention. This diagram is merely an example, which should not unduly limit the scope of the claims herein. One of ordinary skill in the art would recognize other variations, modifications, and alternatives. As shown, this NAND memory sector 700 includes blocks 7001, 7002, . . . 700M arranged in series on a common P-well and shared N global bit lines BL1 through BLN. All row-data lines connected to X-decoder outputs are listed in the left of the figure, where each block includes a top decoder gate BLG for bit line control, a bottom divided decoder gates SLG[0], SLG[1] for source line select odd/even column strings, a series of K word lines connected K pages of the block and two dummy WLs capped on top and bottom of the series. The block also is shared a first CSL[0] and a second CSL[1] with its neighboring block, respectively connected to local source lines of odd/even-column strings selected by SLG[0] and SLG[1].

Referring to FIG. 15, the NAND memory sector 700 is subjected to an erase operation for a selected block 7001. The common P-well region is applied with a read voltage Verase of 18~22V for the block read operation. A corresponding voltage bias conditions associated with all the WLs including dummy WLs, select-gate control lines (BLG, SLGs), and a pair of odd/even-divided CSLs for the selected block 7001 and all unselected blocks 7002 through 700M. In an embodiment, each of the plurality of memory cells in the selected NAND block 7001 is erased by grounding the K word lines WL1[1] through WL1[K] of K pages plus two top and bottom dummy wordlines DMWL1[0] and DMWL1[1] in the selected block to 0V, while applying an erase voltage level Verase of 18~20 V to the common P-well region, setting the first common gate input BLG1, the second common gate input SLG1[0], and the third common gate input SLG1[1], and setting the first common source line CSL1[0] and second CSL1[1] to floating, and setting all global bit lines BL1 through BLN to floating, and setting all other row-data lines to other unselected M−1 blocks to floating, each of plurality of memory cells after erasing being associated with a threshold voltage level below −2.0V. This operation is substantially the same as that applied through the NAND memory sector 600 in it corresponding read operation shown in FIG. 6, except that there are biases for both the first CSL and the second CSL instead of just one bias condition of one CSL in FIG. 6. FIG. 16 is a table listed a set of bias voltage conditions for erase operation of a selected block as described in FIG. 15 according to an alternative embodiment of the present invention.

Figure 17A:
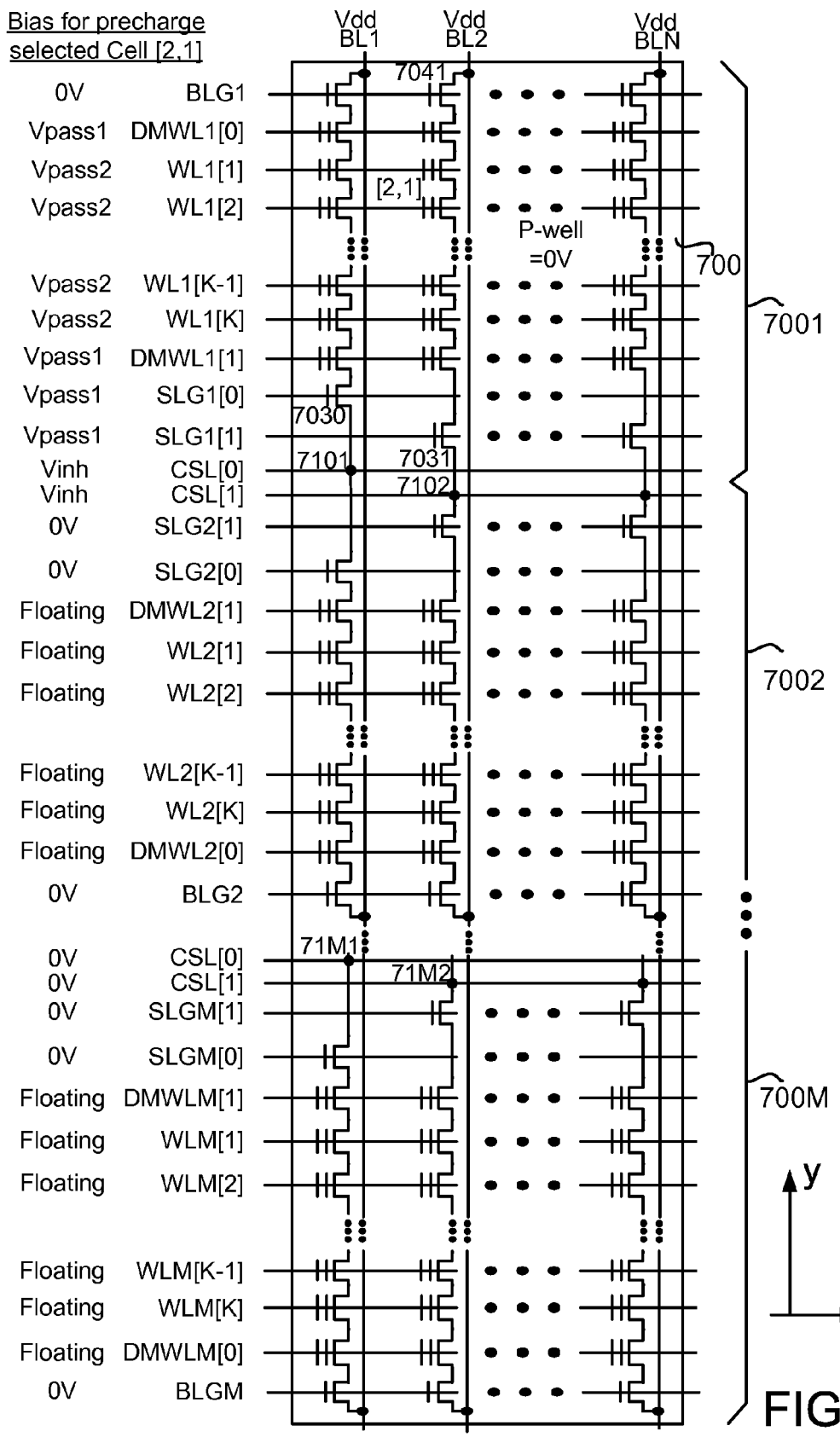
FIG. 17a is a schematic diagram of a NAND memory sector with a set of bias voltage conditions during a pre-charge period of half-page program operation of a selected cell according to an alternative embodiment of the present invention.

FIG. 17a is a schematic diagram of a NAND memory sector with a set of bias voltage conditions during a pre-charge period of half-page program operation of a selected cell according to an alternative embodiment of the present invention. This diagram is merely an example, which should not unduly limit the scope of the claims herein. One of ordinary skill in the art would recognize other variations, modifications, and alternatives. As shown, the new NAND memory sector 700, the same one as described in FIG. 15, is in a program operation. In fact, the proposed three-step program operation method that is applied to the NAND sector 600 described in FIGS. 9a, 9b, and 9c can be substantially copied to the new NAND sector 700. Using the three-step program operation, a string of K memory cells in the selected NAND block 7001 is programmed cell-by-cell sequentially from cell 1 to cell K, by grounding the common P-well region at 0V, performing a pre-charge step, performing a data-setting step, and performing a program step. In particular, FIG. 17a shows an example to execute the first step—a pre-charge cycle of the half-page program operation with non-boosting program-inhibit scheme.

In a specific embodiment, the pre-charge step for programming a selected cell ([2,1]) in the string denoted as BL2 within the selected NAND block 7001 is executed by applying a first pass voltage level Vpass1 of 9~11V to the bottom decoder common gates SLG1[0] and SLG1[1] associated with the selected block to allow local bit lines of both odd and even-column strings being coupled respective with the first and the second common source lines. Additionally, the operation includes setting the BLG1 associated with the selected block 7001 to 0V and the global bit line BL2 associated with the selected cell [2,1] to Vdd. Further, the operation includes applying a second pass voltage level Vpass2 of 6~8V to each of the K word lines from the selected cell [2,1] to the cell [2,K] in the string, while applying the first pass voltage level Vpass1 of 9~11V to a word line of a first cell (e.g., the first dummy cell) located just one ahead of the selected cell [2,1] in the string including the first dummy cell ahead of cell 1 and applying Vdd to all other word lines from cells ahead of the first cell (no in this case) including a first dummy cell. The operation also includes applying the first pass voltage level Vpass1 of 9~11V to the second dummy cell after cell [2,K] and applying a program-inhibit voltage level of 6~8V to the first common source line CSL1[0] and to the second common source line CSL1[1] associated with the selected block 7001 to allow the local bit line 7101 of odd-column string and the local BL 7102 of even-column string being charged at least to the program-inhibit voltage Vinh at 6~8V. Furthermore, the operation includes applying BLG, SLG[0], and SLG[1] associated with all unselected M−1 blocks to 0V. Moreover, the operation includes setting all word lines WLs including dummy word lines DMWLs associated with pages in unselected M−1 blocks to floating and applying all other pairs of the first and second common source lines CSLs not shared with the selected block 7001 to 0V.

FIG. 18a is a table listed a set of bias voltage conditions during a pre-charge period of half-page program operation for a selected cell from all K cells from Cell[2,1] to Cell[2,K] in a string associated with a global bit line BL2 shown in FIG. 17a according to an alternative embodiment of the present invention. For other cells, other strings, other half-page, and other blocks, similar bias conditions for the pre-charge period of half-page program operation can be deduced from the same table shown in this figure.

Figure 17B:
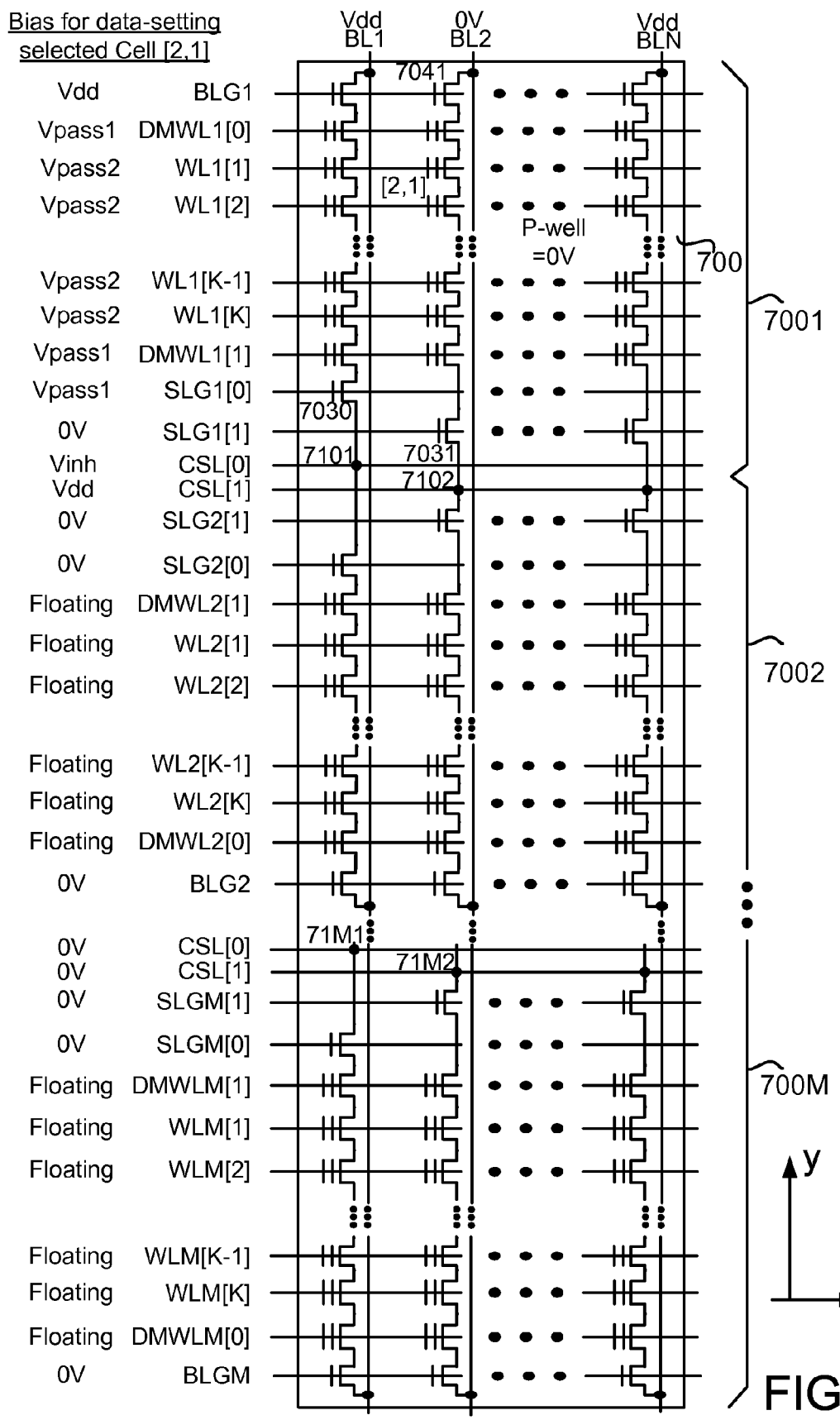
FIG. 17b is a schematic diagram of a NAND memory sector with a set of bias voltage conditions during a data-setting period of half-page program operation of a selected cell according to an alternative embodiment of the present invention.

FIG. 17b is a schematic diagram of a NAND memory sector with a set of bias voltage conditions during a data-setting period of half-page program operation of a selected cell according to an alternative embodiment of the present invention. This diagram is merely an example, which should not unduly limit the scope of the claims herein. One of ordinary skill in the art would recognize other variations, modifications, and alternatives. As shown, the new NAND memory sector 700, the same one as described in FIG. 17a, is continuing a second data-setting step of program operation.

In a specific embodiment, the data-setting step for programming the selected cell ([2,1]) in the string denoted as BL2 within the selected NAND block 7001 just follows the previous pre-charge step. The data-setting operation includes changing the SLG1[1] associated with the selected block 7001 to 0V so that the even-column local SL 7102 disconnects the second common source line CSL1[1] while CSL1[1] being lowered from Vinh level to Vdd level, but the SLG1[0] associated with the selected block is always set at the first pass voltage level Vpass1 of 9~11V to keep corresponding odd-column local SL 7101 coupling with the first common source line CSL1[0] which is still coupled to the program-inhibit voltage level Vinh of 6~8V. Additionally, the operation includes resetting the BLG1 associated with the selected block to Vdd to turn on all BL-select transistors to allow the local BL coupling with the corresponding global BL. In this case, the global BL is BL2, which is set at 0 V by LV PGM buffer to allow discharging of the local BL of the string. Furthermore, the operation retains all other global bit lines to Vdd level to inhibit discharging of corresponding other local bit lines.

FIG. 18b is a table listed a set of bias voltage conditions during a data-setting period of half-page program operation of a selected cell from all K cells from Cell[2,1] to Cell[2,K] in a string associated with a global bit line BL2 shown in FIG. 17b according to an alternative embodiment of the present invention. For other cells, other strings, other half-page, and other blocks, similar bias conditions for the data-setting period of half-page program operation can be deduced from the same table shown in this figure.

Figure 17C:
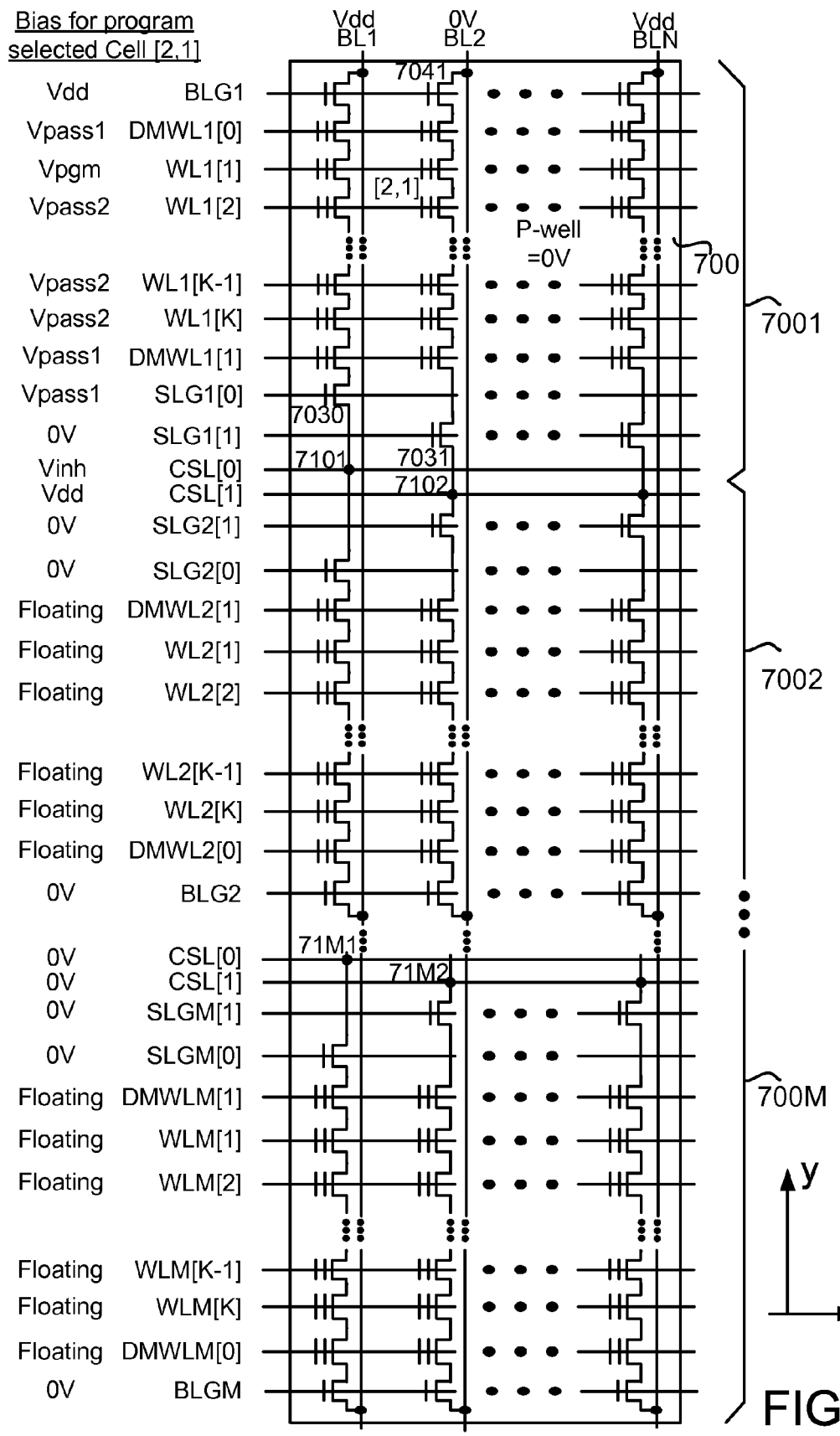
FIG. 17c is a schematic diagram of a NAND memory sector with a set of bias voltage conditions during a programming period of half-page program operation of a selected cell according to an alternative embodiment of the present invention.

FIG. 17c is a schematic diagram of a NAND memory sector with a set of bias voltage conditions during a programming period of half-page program operation of a selected cell according to an alternative embodiment of the present invention. This diagram is merely an example, which should not unduly limit the scope of the claims herein. One of ordinary skill in the art would recognize other variations, modifications, and alternatives. As shown, the new NAND memory sector 700, the same one as described in FIGS. 17a and 17b, is continuing a third programming step of program operation.

In a specific embodiment, the program step for programming the selected cell ([2,1]) in the string denoted as BL2 within the selected NAND block 7001 continues to follow previous data-setting step. The programming step applies a program voltage level Vpgm of 15~22V to the selected word line WL1[1] while retaining the second pass voltage level Vpass2 of 6~8V to all word lines WLs from a second cell located after the selected cell [2,1] through the string to the cell [2,K]. Furthermore, the programming step applies the first pass voltage level Vpass1 of 9~11V to the WLs located just one ahead of the selected cell [2,1] in the string including a first dummy WL (in the current case, there is just one WL which is just the first dummy DMWL1[0]). Moreover, the programming step applies Vdd to other WLs from cells ahead of the first cell in the string including a first dummy cell (in current case, there is none). Again, this is a half-page program operation and in current case it is executed for a selected cell in even-column half page. During the programming step, the second common source line CSL1[1] is kept at Vdd to reduce the bias voltage difference from (Vinh−0) to (Vinh−Vdd) between the bit line and source line for the selected string.

FIG. 18c is a table listed a set of bias voltage conditions during a program period of half-page program operation of a selected cell from all K cells from Cell[2,1] to Cell[2,K] in a string associated with a global bit line BL2 shown in FIG. 17c according to an alternative embodiment of the present invention. For other cells, other strings, other half-page, and other blocks, similar bias conditions for the program period of half-page program operation can be deduced from the same table shown in this figure.

Figure 19:
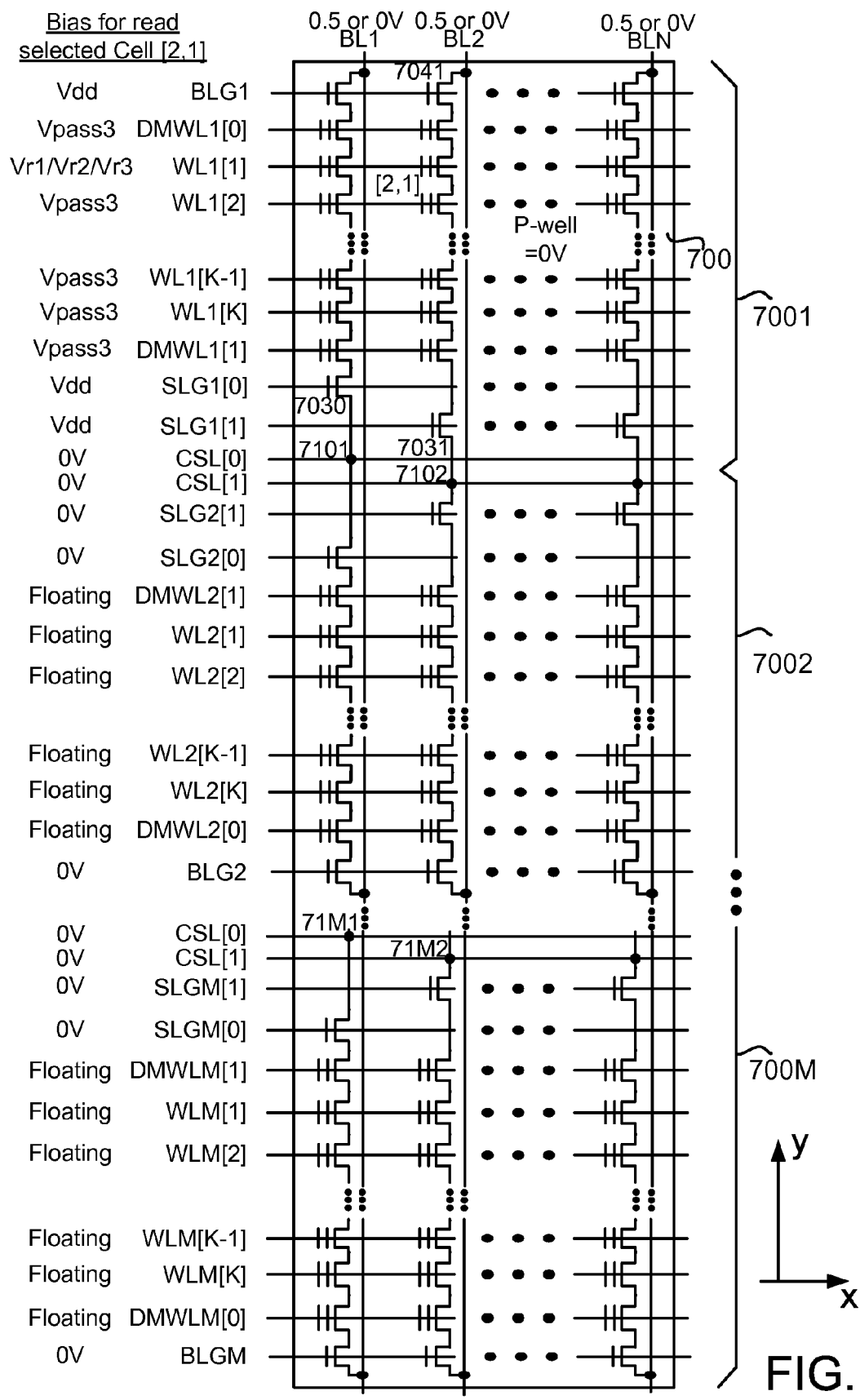
FIG. 19 is a schematic diagram of a NAND memory sector with a set of bias voltage conditions for read operation of a selected cell according to an alternative embodiment of the present invention.

FIG. 19 is a schematic diagram of a NAND memory sector with a set of bias voltage conditions for read operation of a selected cell according to an alternative embodiment of the present invention. This diagram is merely an example, which should not unduly limit the scope of the claims herein. One of ordinary skill in the art would recognize other variations, modifications, and alternatives. As shown, the new NAND memory sector 700, the same one as described in FIG. 15, is in a read operation. In a specific embodiment, a selected cell [2,1] in a selected NAND block 7001 is read by applying the word line WL1[1] of the selected cell [2,1] to a read voltage level Vr and setting all other word lines WLs to a third pass voltage level Vpass3 of 5~6V, while setting the BLG1, SLG1 [0], and SLG1[1] of the selected NAND block to Vdd to open local bit lines and local source lines. All N global bit lines BL1 through BLN are set to either 0.5V or 0V while the common P-well region is grounded at 0V. Additionally, the read operation includes setting both the first common source line CSL1 [0] and second common source line CSL1[1] to 0V. Furthermore, All other BL or SL-select gates associated with the unselected M−1 NAND blocks are set to 0V. All word lines WLs including two dummy word lines DMWLs associated with the unselected M−1 NAND blocks are set to floating states. All other first and second common source lines CSLs not shared with the selected block 7001 are set to 0V.

FIG. 20 is a table listed a set of bias voltage conditions for read operation of a selected cell according to an alternative embodiment of the present invention. For other cells, other strings, other half-page, and other blocks, similar bias conditions for the read operation can be deduced from the same table shown in this figure. If the memory cells in the selected page of the selected NAND block are multi-level cells, the read voltage level is incrementally increased three times from Vr0 to Vr1, Vr2, and Vr3 respectively to read out three distinguished threshold voltage levels stored in the memory cells, wherein Vr0 is 0 V, Vr1 is 1.5 V, Vr2 is 2.5 V, and Vr3 is 3.5 V along with four threshold voltage levels of Vt0 of −2.0 V, Vt1 of ~1V, Vt2 of ~2V, and Vt3 of ~3V.

In a specific embodiment, the present invention provides an NAND memory block circuit with non-boosting program-inhibit scheme. The NAND memory block includes a NAND cell array comprising a plurality of memory cells built in a common P-well region and arranged as multiple pages in rows and multiple strings in columns sharing a common source line. This NAND memory block is exemplarily illustrated in FIG. 3, with all the corresponding multiple strings being laid in y-direction and all word lines associated with multiple pages being laid in x-direction. Each page is associated with a word line and each string is associated with a local source line and a local bit line. The NAND memory block further includes a first string decoder located at one end of the multiple strings. The first string decoder includes a row of 1-poly NMOS select-gate transistors having a first common gate input and respectively connecting to local bit lines of corresponding strings and respective global bin lines. Additionally, the NAND memory block includes a second string decoder located at another end of the multiple strings. The second string decoder includes a row of divided odd-column and even-column 1-poly NMOS select-gate transistors for separating odd-column local source lines and even-column local source lines respectively gated by a second common gate input and a third common gate input to control their coupling to the common source line. The second string decoder is configured to independently select odd/even-column local source line voltages to maintain different local bit line voltages so that a programming operation can be performed in unit of half-page in which selected odd/even-column local bit lines are discharged to 0V while unselected even/odd-column bit lines independently retain a program-inhibit voltage without being affected by any coupling noise. The program-inhibit voltage is charged in full page, followed by selectively discharge in either odd or even strings, and retained properly, as depicted in FIGS. 9a, 9b and 9c during a novel three-step program operation, for providing a shielding effect to prevent any cell program error due to coupling effect.

In another specific embodiment, the present invention provides a NAND memory sector circuit with non-boosting program-inhibit scheme. The NAND memory sector includes M numbers of NAND blocks arranged in series sharing a common P-well region and N global bit lines of BL1 through BLN respectively for N strings in y-direction. The M or N is an even number greater than 2 for a typical NAND memory array size. Each NAND memory block is substantially the same as one illustrated in FIG. 3, with all the corresponding multiple strings being laid in y-direction and all word lines associated with multiple pages being laid in x-direction. The same NAND block includes a plurality of memory cells built in the common P-well region and arranged as pages in K rows and strings in the N columns sharing a common source line. Each page is associated with a word line. Each string is associated with a local source line and a local bit line. Each string of K cells is capped by two dummy cells respectively associated with two dummy word lines. K is an even number greater than 2 for typical NAND memory block size. The NAND block further includes a first string decoder located at one end of the N strings. The first string decoder includes a row of 1-poly NMOS select-gate transistors having a first common gate input and respectively connecting to local bit lines of corresponding strings and the N global bin lines BL1 through BLN. Furthermore, the NAND block includes a second string decoder located at another end of the N strings. The second string decoder includes a row of divided odd-column and even-column 1-poly NMOS select-gate transistors for separating odd-column local source lines and even-column local source lines respectively gated by a second common gate input and a third common gate input to control their coupling to the common source line.

Additionally, the NAND memory sector includes an X-decoder circuit configured to connect a plurality of row-data lines in x-direction to the M numbers of NAND blocks. The x-direction is perpendicular to the y-direction. For each NAND block the plurality of row-data lines includes a top decoder line connected to the first common gate input, a pair of bottom decoder lines respectively connected to the second common gate input and the third common gate input. The same plurality of row-data lines includes K numbers of word lines respectively connected to the K pages and a pair of dummy word lines connected to the corresponding two dummy cells. The same plurality of row-data lines further includes a common source line coupled to the local source line of each of the N strings. Moreover, the NAND memory sector includes a low-voltage SA&PGM buffer circuit made from PMOS and NMOS devices with power supply voltages of 3V or less and connected in y-direction with all the global bit lines BL1 through BLN of the M numbers of NAND blocks.

The NAND memory sector is substantially the same one as depicted in FIG. 4, with all global bit lines BL1 through BLN running in the y-direction to receive LV PGM buffer bit line signals and all row-data lines running in the x-direction connected to outputs from the X-decoder. Each consecutive pair of NAND blocks shares one common source line (so total M blocks are associated with M/2 common source lines). The second string decoder in each NAND block is divided to independently select odd/even-column local source line voltages to maintain different local bit line voltages so that a programming operation can be performed in unit of half-page in a selected block of the M numbers of NAND blocks during which selected odd/even-column local bit lines are discharged to 0V while unselected even/odd-column bit lines independently retain a program-inhibit voltage without being affected by any coupling noise. The program-inhibit voltage is charged in full page, followed by selectively discharge in either odd or even strings, and retained properly, as depicted in FIGS. 9a, 9b and 9c during a novel three-step program operation, for providing a shielding effect to prevent any cell program error due to coupling effect.

In an alternative embodiment, the present invention provides a NAND memory sector circuit with non-boosting program-inhibit scheme. The NAND memory sector, substantially the same as one depicted in FIG. 14, includes M numbers of NAND blocks arranged in series sharing a common P-well region and N global bit lines of BL1 through BLN respectively for N strings in y-direction, where M, N is an even number greater than 2. The NAND block includes a plurality of memory cells built in the common P-well region and arranged as pages in K rows and strings in the N columns. Each page is associated with a word line. Each string is associated with a local source line and a local bit line. Each string of K cells is capped by two dummy cells respectively associated with two dummy word lines, where K is an even number greater than 2. Additionally, the NAND block includes a first string decoder located at one end of the N strings. The first string decoder includes a row of 1-poly NMOS select-gate transistors having a first common gate input and respectively connecting to local bit lines of corresponding strings and the N global bin lines BL1 through BLN. The NAND block further includes a second string decoder located at another end of the N strings. The second string decoder includes a row of divided odd-column and even-column 1-poly NMOS select-gate transistors respectively coupled to a second common gate input and a third common gate input.

Furthermore, the same NAND memory sector includes an X-decoder circuit configured to connect a plurality of row-data lines in x-direction to the M numbers of NAND blocks, where the x-direction is perpendicular to the y-direction. For each NAND block the plurality of row-data lines includes a top decoder line connected to the first common gate input, a pair of bottom decoder lines for separating odd-column local source lines and even-column local source lines respectively gated by a second common gate input and a third common gate input to control their couplings respectively to a first common source line and a second common source line. The same plurality of row-data lines further includes K numbers of word lines respectively connected to the K pages and a pair of dummy word lines connected to the corresponding two dummy cells. The same plurality of row-data lines also includes and the first and second common source lines shared with a neighboring NAND block. Moreover, the NAND memory sector includes a low-voltage SA&PGM buffer circuit made from PMOS and NMOS devices with power supply voltages of 3V or less and connected in y-direction with all the global bit lines BL1 through BLN of the M numbers of NAND blocks.

In yet a specific embodiment, each consecutive pair of NAND blocks shares the pair of the first and second common source lines. The second string decoder in each NAND block is divided to independently select odd/even-column local source line voltages to maintain different local bit line voltages so that a programming operation can be performed in unit of half-page in a selected block of the M numbers of NAND blocks during which selected odd/even-column local bit lines are discharged to 0V while unselected even/odd-column bit lines independently retain a program-inhibit voltage applied respectively through the second/first common source line without being affected by any coupling noise. The program-inhibit voltage is charged in full page, followed by selectively discharge in either odd or even strings, and retained properly, as depicted in FIGS. 17a, 17b and 17c during a novel three-step program operation, for providing a shielding effect to prevent any cell program error due to coupling effect.

Although the above has been illustrated according to specific embodiments, there can be other modifications, alternatives, and variations. It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A NAND memory block circuit with non-boosting program-inhibit scheme, the memory block comprising:
   a NAND cell array comprising a plurality of memory cells built in a common P-well region and arranged as multiple pages in rows and multiple strings in columns sharing a common source line, each page being associated with a word line and each string being associated with a local source line and a local bit line;
   a first string decoder located at one end of the multiple strings, the first string decoder comprising a row of 1-poly NMOS select-gate transistors having a first common gate input and respectively connecting to the local bit lines of corresponding strings and respective global bit lines; and
   a second string decoder located at another end of the multiple strings, the second string decoder comprising a row of divided odd-column and even-column 1-poly NMOS select-gate transistors for separating odd-column local source lines and even-column local source lines respectively gated by a second common gate input and a third common gate input to control their coupling to the common source line;
   wherein the second string decoder is configured to independently select odd/even-column local source line voltages to maintain different local bit line voltages so that a programming operation can be performed in unit of half-page in which both odd and even-column strings are initially precharged in one cycle to a program-inhibit voltage of 6-8V from the common source line and selected odd/even-column local bit lines are discharged to 0V or retained at the program-inhibit voltage in accordance with Vss and/or Vdd data setting via half-page global bit lines in two cycles while unselected even/odd-column local bit lines independently retain the program-inhibit voltage without being affected by any coupling noise.

2. The NAND memory block circuit of claim 1 wherein each memory cell comprises one 2-poly High-voltage floating gate transistor.

3. The NAND memory block circuit of claim 1 wherein each cell string comprises multiple memory cells connected in series including two dummy cells respectively connected their gates to the corresponding word lines.

4. The NAND memory block circuit of claim 1 wherein each of the plurality of memory cells is erased by coupling all word lines including two dummy word lines to 0V while applying an erase voltage level of 18~22 V to the common P-well region, setting the first common gate input, the second common gate input, the third common gate input, and the common source line to floating, and setting all global bit lines to floating, each of plurality of the memory cells being erased to associate with a threshold voltage level below −2.0 V.

5. The NAND memory block circuit of claim 1 wherein a string of K memory cells in the NAND cell array is programmed cell by cell sequentially from cell 1 to cell K, K being a length of the string, by grounding the common P-well region at 0v.

6. The NAND memory block circuit of claim 5 wherein a precharge step for programming a selected cell in the string comprises:
   applying a first pass voltage level to the second/third common gate input to allow the local source lines of both odd and even-column strings being coupled with the common source line, the first pass voltage level being set at 9~11V;
   setting the first common gate input to 0V to close local bit lines coupling with corresponding global bit lines;
   setting all the global bit lines to Vdd;
   applying a second pass voltage level to each of the word lines from the selected cell to the cell K in the string, while applying the first pass voltage level to a word line of a first cell located just one ahead of the selected cell in the string including a first dummy cell ahead of cell 1 and applying Vdd to all word lines from cells ahead of the first cell in the string including a first dummy cell, the second pass voltage level being set at 6~8V;
   applying the first pass voltage level to a second dummy cell after cell K; and
   applying a program-inhibit voltage level to the common source line to allow the local bit line corresponding to the string being charged at least to the program-inhibit voltage through coupling from corresponding local source lines, the program-inhibit voltage level being set at 6~8V.

7. The NAND memory block circuit of claim 6 wherein a data-setting step for programming the selected cell in the string further comprises:
   changing the third common gate input to 0V to disconnect even-column local source lines from the common source line;
   retaining the second common gate input at the first pass voltage level to couple the odd-column local source lines with the common source line at the program-inhibit voltage level;
   resetting the first common gate input to Vdd to allow all local bit lines to access corresponding global bit lines;
   selecting the global bit line associated with the selected cell in the even-column string at 0 V to allow discharging of the corresponding local bit line, while retaining all other global bit lines to Vdd to inhibit discharging of all other local bit lines.

8. The NAND memory block circuit of claim 7 wherein a program step for programming the selected cell in the string further comprises:
   keeping the second common gate input at the first pass voltage level to always retain the odd-column local source lines to be coupled with the common source line at the program-inhibit voltage level; and
   applying a program voltage level to the word line of the selected cell associated with the discharged even-column local bit line, while retaining the second pass voltage level to other word lines from a second cell next to the selected cell through the string to the last cell K, and applying the first pass voltage level to the word line of the first cell located just one ahead of the selected cell in the string including a first dummy cell and applying Vdd to rest word lines from cells ahead of the first cell in the string including a first dummy cell, the program voltage level being set at 15~22V.

9. The NAND memory block circuit of claim 7 wherein the data-setting step further comprises switching the third common gate input to the first pass voltage level and the second common gate input to 0V for further performing a half page program operation to cells belonging to odd-column strings.

10. The NAND memory block circuit of claim 7 wherein one even/odd-column strings in the NAND cell array is associated with a local bit line discharged down to 0 V and sandwiched by two odd/even-column strings with corresponding local source lines being held at the program inhibit voltage level to induce a shielding effect preventing the selected even/odd-column string to from pulling its channel voltage to low by coupling effect.

11. The NAND memory block circuit of claim 8 wherein the selected cell being programmed comprises a threshold voltage level increased to a positive $V_t$ level, wherein the $V_t$ level is about +2.0 V if the selected cell is a single-level cell and the $V_t$ level has three values of 1.0 V, 2.5 V and 4.0 V if the selected cell is a multi-level cell.

12. The NAND memory block circuit of claim 1 wherein a selected cell in the NAND cell array is read by applying the word line associated with the selected cell to a read voltage level and setting all other word lines to a third pass voltage level of 5~6V, while setting the first, second, and third common gate input to Vdd and all global bit lines to 0.5V or 0V, setting the common source line to 0V, and grounding the common P-well region at 0V.

13. The NAND memory block circuit of claim 12 wherein if the memory cells in the selected page are multi-level cells, the read voltage level is incrementally increased three times from Vr0 to Vr1, Vr2, and Vr3 respectively to read out three distinguished threshold voltage levels stored in the memory cells, wherein Vr0 is 0 V, Vr1 is 1.5 V, Vr2 is 2.5 V, and Vr3 is 3.5 V along with four threshold voltage levels of Vt0 of −2.0 V, Vt1 of ~1V, Vt2 of ~2V, and Vt3 of ~3V.

14. A NAND memory sector circuit with non-boosting program-inhibit scheme, the memory sector comprising:
  M numbers of NAND blocks arranged in series sharing a common P-well region and N global bit lines of BL1 through BLN respectively for N strings in y-direction, M, N being an even number greater than 2, the NAND block comprising:
    a plurality of memory cells built in the common P-well region and arranged as pages in K rows and strings in the N columns sharing a common source line, each page being associated with a word line, each string being associated with a local source line and a local bit line, and each string of K cells being capped by two dummy cells respectively associated with two dummy word lines, K being an even number greater than 2;
    a first string decoder located at one end of the N strings, the first string decoder comprising a row of 1-poly NMOS select-gate transistors having a first common gate input and respectively connecting to local bit lines of corresponding strings and the N global bit lines BL1 through BLN; and
    a second string decoder located at another end of the N strings, the second string decoder comprising a row of divided odd-column and even-column 1-poly NMOS select-gate transistors for separating odd-column local source lines and even-column local source lines respectively gated by a second common gate input and a third common gate input to control their coupling to the common source line;
  an X-decoder circuit configured to connect a plurality of row-data lines in x-direction to the M numbers of NAND blocks, the x-direction being perpendicular to the y-direction, wherein for each NAND block the plurality of row-data lines includes a top decoder line connected to the first common gate input, a pair of bottom decoder lines respectively connected to the second common gate input and the third common gate input, K numbers of word lines respectively connected to the K pages and a pair of dummy word lines connected to the corresponding two dummy cells, and a common source line coupled to the local source line of each of the N strings; and
  a low-voltage SA&PGM buffer circuit made from PMOS and NMOS devices with power supply voltages of 3V or less and connected in y-direction with all the global bit lines BL1 through BLN of the M numbers of NAND blocks;
  wherein each consecutive pair of NAND blocks shares the common source line; the second string decoder in each NAND block is divided to independently select odd/even-column local source line voltages to maintain different local bit line voltages so that a programming operation can be performed in unit of half-page in a selected block of the M numbers of NAND blocks during which both odd and even-column strings are initially precharged in one cycle to a program-inhibit voltage of 6-8V from the common source line of the selected block without charging from the low-voltage SA&PGM buffer through many unselected blocks and selected odd/even-column local bit lines are discharged to 0V or retained at the program-inhibit voltage in accordance with Vss/Vdd data setting via half-page global bit lines in two cycles while unselected even/odd-column bit lines independently retain the program-inhibit voltage without being affected by any coupling noise.

15. The NAND memory sector circuit of claim 14 wherein each of the plurality of memory cells in a selected NAND block is erased by grounding the K word lines including two dummy word lines in the selected NAND block to 0V and while applying an erase voltage level of 18~20 V to the common P-well region, setting the first common gate input, the second common gate input, the third common gate input, and the common source line to floating, and setting all global bit lines BL1 through BLN to floating, and setting all other row-data lines to other unselected M−1 blocks to floating, each of plurality of memory cells after erasing being associated with a threshold voltage level below −2.0 V.

16. The NAND memory sector circuit of claim 14 wherein a string of K memory cells in a selected NAND block is programmed cell-by-cell sequentially from cell 1 to cell K, by grounding the common P-well region at 0v.

17. The NAND memory sector circuit of claim 16 wherein a precharge step for programming a selected cell in the string within the selected NAND block comprises:
  applying a first pass voltage level to the second/third common gate input associated with the selected block to allow the local source lines of both odd and even-column strings being coupled with the common source line, the first pass voltage level being set at 9~11V;
  setting the first common gate input associated with the selected block to 0V to close all local bit lines coupling corresponding global bit lines;
  setting all global bit lines to Vdd;
  applying a second pass voltage level to each of the K word lines from the selected cell to the cell K in the string, while applying the first pass voltage level to a word line of a first cell located just one ahead of the selected cell in the string including the first dummy cell ahead of cell 1 and applying Vdd to other word lines from cells ahead of the first cell including a first dummy cell, the second pass voltage level being set at 6~8V;
  applying the first pass voltage level to the second dummy cell after cell K;
  applying a program-inhibit voltage level to the common source line associated with the selected block to allow the local bit lines being charged at least to the program-inhibit voltage through coupling from corresponding local source lines, the program-inhibit voltage level being set at 6~8V;

applying the first common gate input, the second common gate input, and the third common gate input associated with all unselected M−1 blocks to 0V;

setting all word lines including dummy word lines associated with pages in unselected M−1 blocks to floating; and applying all other common source lines not shared with the selected block to 0V.

18. The NAND memory sector circuit of claim 17 wherein a data-setting step for programming the selected cell in the string within the selected NAND block further comprises:

changing the third common gate input associated with the selected block to 0V to disconnect even-column local source lines from the common source line;

retaining the second common gate input at the first pass voltage level to keep coupling the odd-column local source lines with the common source line at the program-inhibit voltage level;

resetting the first common gate input to Vdd to allow all local bit lines to access corresponding global bit lines; and selecting the global bit line associated with the selected cell in the even-column string at 0 V to allow discharging of the corresponding local bit line, while retaining all other global bit lines to Vdd to inhibit discharging of all other local bit lines.

19. The NAND memory sector circuit of claim 18 wherein a program step for programming the selected cell in the string within the selected NAND block further comprises:

keeping the second common gate input at the first pass voltage level to always retain the odd-column local source lines to be coupled with the common source line at the program-inhibit voltage level; and applying a program voltage level to the word line of the selected cell associated with the discharged even-column local bit line, while retaining the second pass voltage level to other word lines from a second cell next to the selected cell through the string to the last cell K, and applying the first pass voltage level to the word line of the first cell located just one ahead of the selected cell in the string including a first dummy cell and applying Vdd to rest word lines from cells ahead of the first cell in the string including a first dummy cell, the program voltage level being set at 15~22V.

20. The NAND memory sector circuit of claim 18 wherein the data-setting step further comprises switching the third common gate input to the first pass voltage level and the second common gate input to 0V for further performing a half page program operation to cells belonging to odd-column strings within the selected NAND block.

21. The NAND memory sector circuit of claim 18 wherein any even/odd-column strings in the NAND cell array is associated with a local bit line discharged down to 0 V and sandwiched by two odd/even-column strings with corresponding local source lines being held at the program inhibit voltage level to induce a shielding effect preventing the selected even/odd-column string to from pulling its channel voltage to low by coupling effect.

22. The NAND memory sector circuit of claim 14 wherein a selected cell in a selected NAND block is read by applying the word line of the selected cell to a read voltage level and setting all other word lines to a third pass voltage level of 5~6V, while setting the first, second, and third common gate input of the selected NAND block to Vdd and all N global bit lines BL1 through BLN to 0.5V or 0V, setting the common source line to 0V, setting the first, second, and third common gate input associated with the unselected M−1 NAND block to 0V, setting all word lines including two dummy word lines associated with the unselected M−1 NAND blocks to floating, setting all the common source lines not shared with the selected block to 0V, and grounding the common P-well region at 0V.

23. The NAND memory sector circuit of claim 22 wherein if the memory cells in the selected page of the selected NAND block are multi-level cells, the read voltage level is incrementally increased three times from Vr0 to Vr1, Vr2, and Vr3 respectively to read out three distinguished threshold voltage levels stored in the memory cells, wherein Vr0 is 0 V, Vr1 is 1.5 V, Vr2 is 2.5 V, and Vr3 is 3.5 V along with four threshold voltage levels of Vt0 of −2.0 V, Vt1 of ~1V, Vt2 of ~2V, and Vt3 of ~3V.

24. A NAND memory sector circuit with non-boosting program-inhibit scheme, the memory sector comprising:

M numbers of NAND blocks arranged in series sharing a common P-well region and N global bit lines of BL1 through BLN respectively for N strings in y-direction, M, N being an even number greater than 2, the NAND block comprising:

a plurality of memory cells built in the common P-well region and arranged as pages in K rows and strings in the N columns, each page being associated with a word line, each string being associated with a local source line and a local bit line, and each string of K cells being capped by two dummy cells respectively associated with two dummy word lines, K being an even number greater than 2;

a first string decoder located at one end of the N strings, the first string decoder comprising a row of 1-poly NMOS select-gate transistors having a first common gate input and respectively connecting to local bit lines of corresponding strings and the N global bit lines BL1 through BLN; and a second string decoder located at another end of the N strings, the second string decoder comprising a row of divided odd-column and even-column 1-poly NMOS select-gate transistors separating odd-column local source lines and even-column local source lines respectively gated by a second common gate input and a third common gate input to control their couplings respectively to a first common source line and a second common source line;

an X-decoder circuit configured to connect a plurality of row-data lines in x-direction to the M numbers of NAND blocks, the x-direction being perpendicular to the y-direction, wherein for each NAND block the plurality of row-data lines includes a top decoder line connected to the first common gate input, a pair of bottom decoder lines respectively connected to the second common gate input and the third common gate input, K numbers of word lines respectively connected to the K pages and a pair of dummy word lines connected to the corresponding two dummy cells, the first and second common source lines shared with a neighboring NAND block; and a low-voltage SA&PGM buffer circuit made from PMOS and NMOS devices with power supply voltages of 3V or less and connected in y-direction with all the global bit lines BL1 through BLN of the M numbers of NAND blocks;

wherein the second string decoder in each NAND block is divided to independently select odd/even-column local source line voltages to maintain different local bit line voltages so that a programming operation can be performed in unit of half-page in a selected block of the M numbers of NAND blocks during which both odd and even-column strings are initially precharged in one cycle to a program-inhibit voltage of 6-8V from the common source line of the selected block without charging from the low-voltage SA&PGM buffer through many unselected blocks and selected odd/even-column local bit lines are discharged to 0V or retained at the program-inhibit voltage in accordance with Vss/Vdd data setting via the global bit lines in two cycles while unselected even/odd-column bit lines independently retain the program-inhibit voltage applied respectively through the second/first common source line without being affected by any coupling noise.

25. The NAND memory sector circuit of claim 24 wherein each of the plurality of memory cells in a selected NAND block is erased by grounding the K word lines of K pages including two dummy word lines in the selected block to 0V and while applying an erase voltage level of 18~20 V to the common P-well region, setting the first common gate input, the second common gate input, the third common gate input, and the first and second common source lines to floating, and setting all global bit lines BL1 through BLN to floating, and setting all other row-data lines to other unselected M−1 blocks to floating, each of plurality of memory cells after erasing being associated with a threshold voltage level below −2.0 V.

26. The NAND memory sector circuit of claim 24 wherein a string of K memory cells in a selected NAND block is programmed cell-by-cell sequentially from cell 1 to cell K, by grounding the common P-well region at 0v.

27. The NAND memory sector circuit of claim 26 wherein a data setting step for programming a selected cell in the string within the selected NAND block comprises:
 applying a first pass voltage level to the second/third common gate input associated with the selected block to allow the local source lines of both odd and even-column strings being coupled respectively with the first and second common source line, the first pass voltage level being set at 9~11V;
 setting the first common gate input associated with the selected block to 0V to close all local bit lines coupling corresponding global bit lines;
 setting all global bit lines to Vdd;
 applying a second pass voltage level to each of the K word lines from the selected cell to the cell K in the string, while applying the first pass voltage level to a word line of a first cell located just one ahead of the selected cell in the string including the first dummy cell ahead of cell 1 and applying Vdd to all other word lines from cells ahead of the first cell including a first dummy cell, the second pass voltage level being set at 6~8V;
 applying the first pass voltage level to the second dummy cell after cell K;
 applying a program-inhibit voltage level to both the first common source line and the second common source line associated with the selected block to allow both odd and even-column local bit lines being charged at least to the program-inhibit voltage through coupling from corresponding odd and even-column local source lines, the program-inhibit voltage level being set at 6~8V;
 applying the first common gate input, the second common gate input, and the third common gate input associated with all unselected M−1 blocks to 0V;
 setting all word lines including dummy word lines associated with pages in unselected M−1 blocks to floating; and
 applying all other pairs of the first and second common source lines not shared with the selected block to 0V.

28. The NAND memory sector circuit of claim 27 wherein a data-setting step for programming the selected cell in the string within the selected NAND block further comprises:
 keeping the first common source line at the program-inhibit voltage level;
 lowering the second common source line from the program-inhibit voltage level to a Vdd level;
 changing the third common gate input associated with the selected block to 0V to disconnect even-column local source lines from the second common source line;
 retaining the second common gate input at the first pass voltage level to keep coupling the odd-column local source lines with the first common source line at the program-inhibit voltage level;
 resetting the first common gate input to Vdd to allow all local bit lines to access corresponding global bit lines; and
 selecting the global bit line associated with the selected cell in the even-column string at 0 V to allow discharging of the corresponding local bit line of the selected cell, while retaining all other global bit lines to Vdd to inhibit discharging of all other unselected local bit lines.

29. The NAND memory sector circuit of claim 28 wherein a program step for programming the selected cell in the string within the selected NAND block further comprises:
 keeping the second common gate input at the first pass voltage level to always retain the odd-column local source lines to be coupled with the first common source line at the program-inhibit voltage level; and
 applying a program voltage level to the word line of the selected cell associated with the discharged even-column local bit line, while retaining the second pass voltage level to other word lines from a second cell next to the selected cell through the string to the last cell K, and applying the first pass voltage level to the word line of the first cell located just one ahead of the selected cell in the string including a first dummy cell and applying Vdd to rest word lines from cells ahead of the first cell in the string including a first dummy cell, the program voltage level being set at 15~22V.

30. The NAND memory sector circuit of claim 28 wherein the data-setting step further comprises switching the third common gate input to the first pass voltage level and the second common gate input to 0V for further performing a half page program operation to cells belonging to odd-column strings within the selected NAND block.

31. The NAND memory sector circuit of claim 28 wherein any even/odd-column strings in the NAND cell array is associated with a local bit line discharged down to 0 V and sandwiched by two odd/even-column strings with corresponding local source lines being held at the program inhibit voltage level to induce a shielding effect preventing the selected even/odd-column string to from pulling its channel voltage to low by coupling effect.

32. The NAND memory sector circuit of claim 24 wherein a selected cell in a selected NAND block is read by applying the word line of the selected cell to a read voltage level and setting all other word lines to a third pass voltage level of 5~6V, while setting the first, second, and third common gate input of the selected NAND block to Vdd and all N global bit lines BL1 through BLN to 0.5V or 0V, setting both the first and second common source lines to 0V, setting the first, second, and third common gate input associated with the unselected M−1 NAND block to 0V, setting all word lines including two dummy word lines associated with the unselected M−1 NAND blocks to floating, setting all the first and second common source lines not shared with the selected block to 0V, and grounding the common P-well region at 0V.

33. The NAND memory sector circuit of claim 32 wherein if the memory cells in the selected page of the selected NAND block are multi-level cells, the read voltage level is incrementally increased three times from Vr0 to Vr1, Vr2, and Vr3 respectively to read out three distinguished threshold voltage levels stored in the memory cells, wherein Vr0 is 0 V, Vr1 is 1.5 V, Vr2 is 2.5 V, and Vr3 is 3.5 V along with four threshold voltage levels of Vt0 of −2.0 V, Vt1 of ~1V, Vt2 of ~2V, and Vt3 of ~3V.

* * * * *